(12) United States Patent
Sakimura et al.

(10) Patent No.: US 7,688,617 B2
(45) Date of Patent: Mar. 30, 2010

(54) MRAM AND OPERATION METHOD OF THE SAME

(75) Inventors: Noboru Sakimura, Tokyo (JP); Takeshi Honda, Tokyo (JP); Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 149 days.

(21) Appl. No.: 12/083,692

(22) PCT Filed: Oct. 17, 2006

(86) PCT No.: PCT/JP2006/320609

§ 371 (c)(1),
(2), (4) Date: Apr. 17, 2008

(87) PCT Pub. No.: WO2007/046349

PCT Pub. Date: Apr. 26, 2007

(65) Prior Publication Data

US 2009/0141544 A1 Jun. 4, 2009

(30) Foreign Application Priority Data

Oct. 18, 2005 (JP) ............................. 2005-302933

(51) Int. Cl.
*G11C 11/02* (2006.01)
(52) U.S. Cl. .................................. 365/158; 365/210.1
(58) Field of Classification Search ............... 365/210.1
See application file for complete search history.

(56) References Cited

U.S. PATENT DOCUMENTS 6,055,178 A * 4/2000 Naji ........................... 365/158

(Continued)

FOREIGN PATENT DOCUMENTS

JP 2003-68096 3/2003

(Continued)

OTHER PUBLICATIONS

International Search Report dated Jul. 22, 2008 with Partial English-Language Translation.

(Continued)

*Primary Examiner*—Tan T. Nguyen
(74) *Attorney, Agent, or Firm*—McGinn IP Law Group, PLLC

(57) ABSTRACT

An operation method of an MRAM of the present invention is an operation method of the MRAM in which a data write operation is carried out in a toggle write. The operation method of the present invention includes: (A) reading a data from a data cell by using a reference signal which is generated by using a reference cell; (B) performing an error detection on the read data; (C) correcting the data stored in the data cell, when an error is detected in the read data; (D) reading the data from the data cell as a first re-read data after the (C), when the error is detected in the read data, (E) performing the error detection on the first re-read data; (F) correcting the data stored in the reference cell, when an error is detected in the first re-read data; (G) reading the data from the data cell as a second re-read data after the (F), when the error is detected in the first re-read data; (H) performing the error detection on the second re-read data; and (I) correcting the data stored in the data cell again, when the error is detected in the second re-read data.

11 Claims, 18 Drawing Sheets

U.S. PATENT DOCUMENTS

| | | | |
|---|---|---|---|
| 6,545,906 | B1 | 4/2003 | Savtchenko et al. |
| 6,760,251 | B2 * | 7/2004 | Hidaka ........................ 365/171 |
| 6,885,579 | B2 * | 4/2005 | Sakimura et al. ............ 365/158 |
| 6,898,113 | B2 * | 5/2005 | Tsuji .......................... 365/158 |
| 7,286,429 | B1 * | 10/2007 | Liaw et al. .................. 365/209 |
| 2003/0023922 | A1 | 1/2003 | Davis et al. |
| 2003/0023924 | A1 | 1/2003 | Davis et al. |
| 2003/0023925 | A1 | 1/2003 | Davis et al. |
| 2003/0023926 | A1 | 1/2003 | Davis et al. |
| 2003/0023928 | A1 | 1/2003 | Jedwab et al. |
| 2003/0072174 | A1 | 4/2003 | Savtchenko et al. |
| 2005/0030799 | A1 | 2/2005 | Smith et al. |
| 2005/0055621 | A1 | 3/2005 | Adelmann et al. |

FOREIGN PATENT DOCUMENTS

| | | |
|---|---|---|
| JP | 2003-115195 | 4/2003 |
| JP | 2003-115197 | 4/2003 |
| JP | 2004-319923 | 11/2004 |
| JP | 2005-056556 | 3/2005 |
| JP | 2005-56556 | 3/2005 |
| JP | 2005-85464 | 3/2005 |
| JP | 2006-286047 | 10/2006 |
| WO | WO 2007/046350 | 4/2007 |

OTHER PUBLICATIONS

PCT/IB/338, Feb. 11, 2006.
PCT/IB/373, Feb. 11, 2006.
PCT/ISA/237, Feb. 11, 2006.

* cited by examiner

MRAM AND OPERATION METHOD OF THE SAME

TECHNICAL FIELD

The present invention relates to a magnetic random access memory (MRAM), and more particularly relates to a MRAM of a toggle write type.

BACKGROUND ART

A MRAM is a non-volatile memory capable of a write/read operation at a high speed, and the research and development towards practical use has been carried out in recent years.

Generally, in the MRAM, a magneto-resistance element is used for a memory cell. The magneto-resistance element is composed of a magnetization free layer whose magnetization can be reversed, a magnetization pinned layer whose magnetization is pinned, and a non-magnetic layer formed between them. A data is stored as an orientation of the magnetization in the magnetization free layer. When the non-magnetic layer is formed from a very thin insulating film, the magneto-resistance element exhibits a TMR (Tunnel Magneto-Resistance) effect. The magneto-resistance element having such configuration is often referred to as an MTJ (Magnetic Tunnel Junction) element. On the other hand, when the non-magnetic layer is formed of a non-magnetic conductor, the magneto-resistance element exhibits a GMR (Giant Magneto-Resistive) effect. The magneto-resistance element having such configuration is referred to as a CPP-GMR (Current Perpendicular to Plane Giant Magneto-Resistive) element.

The write operation of the data is generally carried out by supplying write currents to a word line and a bit line, which are laid near a memory cell, to apply a magnetic field to the magnetization free layer, and reversing the magnetization of the magnetization free layer to a desirable direction.

On the other hand, when the data is read, the magneto-resistance effect exhibited by the magneto-resistance element is used. When any of the TMR effect and the GMR effect is used, the resistance of the memory cell varies on the basis of the magnetization orientation of the magnetization free layer. This change in the resistance of the memory cell appears as the change in a current flowing through the memory cell or the change in a voltage drop generated in the memory cell. This change in the current flowing through the memory cell or the voltage drop generated in the memory cell is detected, to discriminate the data of the memory cell.

When the data of the memory cell is determined, a reference cell in which a predetermined data is written is used. Hereinafter, in order to discriminate the reference cell, there is a case that the cell actually used to store the data is referred to as a data cell of the memory cells. In the MRAM in which the reference cell is provided, the determination of the data in the data cell is carried out by using the reference cell to generate a reference signal and then comparing a data signal obtained from the data cell with the reference signal.

As known in one skilled in the art, one subject of the MRAM lies in the selection property of the memory cell in a write operation. In the traditional MRAM, due to the variation in property of the memory cell, the data is written into half-selection memory cells, namely, the memory cells in which a write current is supplied to only one of the word line and the bit line. This undesirably reduces the reliability in the operation of the MRAM.

One method to improve the selection property in the write operation of the MRAM is a toggle write scheme (refer to U.S. Pat. No. 6,545,906). The toggle write scheme is a technique for carrying out the write operation whose selection property is high, by using SAF (Synthetic Anti-Ferro-Magnet) in the magnetization free layer. Here, the SAF is a structure in which the adjacent ferromagnetic layers composed of a plurality of ferromagnetic layers are magnetically coupled in anti-ferromagnetic manner.

FIG. 1 is a plan view showing a typical configuration of the MRAM employing the toggle write method. Bit lines 102 and word lines 103 orthogonal to the bit lines 102 extend in a memory array in the MRAM. A magneto-resistance element 101 used as the memory cell is provided at each of positions at which the bit lines 102 and the word lines 103 intersect. As shown in FIG. 2, the magneto-resistance element 101 is composed of a magneto-resistance element, which contains an anti-ferromagnetic layer 111, a magnetization pinned layer 112, a barrier layer 113 and a magnetization free layer 114. As shown in FIG. 1, the magneto-resistance element 101 is arranged such that easy axes of the magnetization pinned layer 112 and the magnetization free layer 114 have the angles of 45 degrees with respect to the bit line 102 and the word line 103, namely, the longitudinal direction of the magneto-resistance element 101 has the angle of 45 degrees with respect to the bit line 102 and the word line 103.

Again, with reference to FIG. 2, the magnetization free layer 114 is composed of ferromagnetic layers 121 and 122 and a non-magnetic layer 123 formed between them. The entire residual magnetization of the magnetization free layer 114 (namely, the entire magnetization of the magnetization free layer 114 when an external magnetic field is 0) is made as close to 0 as possible. This is important, in order to generate a spin flop in the SAF. This condition can be satisfied, for example, by forming the two ferromagnetic layers 121 and 122 so that they are made of the same materials and have the same film thickness.

FIG. 3 is conceptual views showing a procedure of the toggle write operation. FIG. 4 is a diagram showing the waveforms of the currents, which are supplied through the bit line 102 and the word line 103 when the data write operation is carried out based on the toggle write operation. In FIG. 3, attention should be paid to the fact that the magnetizations of the ferromagnetic layers 121 and 122 in the magnetization free layer 114 are indicated by symbols $M_1$, $M_2$, respectively.

The data write operation based on the toggle write method is carried out such that the direction of the magnetic field applied to the magnetization free layer 114 is rotated inside a plane and then the magnetizations of the ferromagnetic layers 121 and 122 of the magnetization free layer 114 are inverted by this magnetic field. Specifically, the write current is firstly supplied to the word line 103. Thus, a magnetic field $H_{WL}$ is generated in a direction orthogonal to the word line 103 (time $t_1$). Subsequently, while the write current is supplied through the word line 103, a write current is supplied to the bit line 102 (time $t_2$). Thus, a magnetic field $H_{WL}+H_{BL}$ is generated in the direction having the angle of 45 degrees with respect for both of the word line 103 and the bit line 102. Moreover, while a write current is supplied through the bit line 102, the supply of the write current to the word line 103 is stopped (time $t_3$). Therefore, a magnetic field $H_{BL}$ is generated in the direction orthogonal to the bit line 102 (namely, the direction parallel to the word line 103). Since with such a procedure, the write currents are supplied to the word line 103 and the bit line 102, the magnetic field applied to the magnetization free layer 114 is rotated, which can rotate the magnetizations of the ferromagnetic layers 121 and 122 of the magnetization free layer 114 by 180 degrees.

The remarkable fact lies in the fact that in the data write operation based on the toggle write method, only the reversal of the magnetization can be carried out, namely, only the reversal of the data can be carried out. For example, when a data "0" is written to a certain target memory cell, the data is firstly read from the target memory cell. Only when the read data is "1", the toggle write is carried out on the target memory cell, and the data "0" is stored in the target memory cell. If the read data is "0", the write operation into the target memory cell is not carried out.

In the foregoing toggle write, even when the write current is supplied to only one of the word line 103 and the bit line 102, the magnetization of the SAF is not reversed in principle. As shown in a graph of FIG. 5 that indicates a region in which the magnetization of the SAF is reversed by the magnetic field generated by the write currents supplied to the bit line and the word line, when the toggle write is employed, the magnetizations of the half-selection memory cells where the write current is supplied through only one of the corresponding word line 103 and bit line 102 are not undesirably reversed in principle. This effectively improves the selection property of the memory cell of the MRAM.

However, even in the MRAM employing the toggle write, it is actually difficult to perfectly prevent a write error. Even if the corresponding write current is supplied to the region shown in FIG. 5, there is a possibility that the magnetization is not reversed, although its probability is very low.

In addition, even in the MRAM employing the toggle write, it is inevitable to avoid software error caused due to thermal disturbance, namely, the undesirable reversal of the magnetization caused due to the thermal disturbance in a probability. The SAF is surely excellent in the durability against the thermal disturbance because its volume can be increased while the entire magnetization is kept small. However, although the probability is very low, it is inevitable to avoid the undesirable reversal of the magnetization caused by the thermal disturbance.

In order to deal with the generation of the write error and software error as mentioned above, similarly to other many memory devices, an error correction is desired to be employed even in the MRAM. For example, as disclosed in Japanese Patent Application Publications (JP-P2003-68096A, JP-P2003-115195A, JP-P2003-115197A, JP-P2005-56556A and JP-P2005-85464A), in the MRAM employing the error correction, an error correction encoding is carried out on a write data when the data is written, and the data after the error correction encoding is written to the memory array. When the data is read, a syndrome is calculated from the data read out from the memory array. When a data error is detected, the data after the error correction is outputted to outside. At this time, the data stored in the memory array is simultaneously corrected.

However, the MRAM employing the toggle write has two matters to be considered when ECC is employed. One is that, even when a data error is detected, whether a cause of the error is in the data cell or the reference cell is not known. There is a case that the thermal disturbance causes the data written in the reference cell to be undesirably reversed although its probability is low. Thus, even if the data error is detected, there is a fear that the simple correction of the data stored in the data cell results in erroneous correction of the data.

However, whether a cause of an error is in the data cell or the reference cell cannot be determined basically and perfectly. Certainly, there may be a difference in an erroneous pattern between the case that the error is in the data cell and the case that the error is in the reference cell. For example, in the case that the error is in the reference cell, a burst error is easily generated, and in the case that the error is in the data cell, a single bit error is easily generated. However, even in the case that the error is in the reference cell, it may appear as the single bit error, depending on the property of the reference cell.

The other matter to be considered lies in that in the toggle write, only the data of the memory cell can be reversed as mentioned above. This has severe influence on the correction of the reference cell. In the write method that can write a specified data, if the desirable data is written into the reference cell and then read out from it, the correction of the reference cell is not originally required. However, when such a method is employed in the toggle write, the read operation from the reference cell is required, which leads to the increase in a read cycle time. Thus, this is not preferable.

In view of such backgrounds, an error correcting technique that is optimal for the MRAM employing the toggle write is desired to be provided.

DISCLOSURE OF INVENTION

It is therefore an object to provide an error correcting technique suitable for an MRAM employing a toggle write. Specifically, an object of the present invention is to provide an MRAM in which, even if whether a cause of a data error is in a data cell or a reference cell is not determined, a data can be correctly corrected at a high probability.

The operation method of the MRAM according to the present invention is an operation method of the MRAM in which a data write operation is carried out in a toggle write. In one aspect of the present invention, the operation method includes:

(A) reading a data from a data cell (17) by using a reference signal which is generated by using a reference cell (18);

(B) performing an error detection on the read data;

(C) correcting the data stored in the data cell, when an error is detected in the read data;

(D) reading the data from the data cell as a first re-read data after the (C), when the error is detected in the read data;

(E) performing the error detection on the first re-read data;

(F) correcting the data stored in the reference cell, when an error is detected in the first re-read data;

(G) reading the data from the data cell as a second re-read data after the (F), when the error is detected in the first re-read data;

(H) performing the error detection on the second re-read data; and (I) correcting the data stored in the data cell again, when the error is detected in the second re-read data.

According to the foregoing operation method, even if whether a cause of the data error is in the data cell or the reference cell cannot be determined, the data can be correctly corrected at a high probability, under a condition that a data error rate is sufficiently decreased.

Preferably, the (A) to (C) steps are carried out in one of a plurality of read cycles, and the (D) to (I) steps are carried out after the completion of the final one of the plurality of read cycles.

In order to execute the (A) to (G) steps without any refusal of an access from outside, preferably, the (A) to (C) steps are carried out in the first one of the plurality of read cycles, and the (D) to (I) steps are carried out in a second one of the plurality of read cycles after the first read cycle, and the (G) step is carried out in a third one of the plurality of read cycles after the second read cycle.

In another aspect of the present invention, the operation method of the MRAM is the operation method of the MRAM which contains first to $n^{th}$ data cells ad first to $n^{th}$ reference cells (n is an integer equal to or more than 3), and in which data write operation is performed by using a toggle write. The operation method contains:

(A-1) reading data from the first to $n^{th}$ data cells as first to $n^{th}$ read data in response to a reference signal which is generated by using the first to $n^{th}$ reference cells, respectively;

(A-2) performing an error detection on the first to $n^{th}$ read data;

(A-3) performing an error correction on a first output data of the first to $n^{th}$ read data to output to the external unit in a first read cycle;

(A-4) correcting the data stored in the first data cell, when an error is detected in the first read data in the first read cycle;

(B-1) performing the error correction on a second output data of the first to $n^{th}$ read data to output to the external unit in a second read cycle after the first read cycle;

(B-2) reading the data from the first data cell as a first re-read data in the second read cycle, when an error is detected in the first read data at the (A-2);

(B-3) performing the error detection on the first re-read data at the second read cycle;

(B-4) correcting the data stored in the first reference cell at the second read cycle, when the error is detected in the first re-read data;

(C-1) performing the error correction on a third output data of the first to third read data to output to an external unit in a third read cycle after the second read cycle;

(C-2) reading the data from the first data cell as a second re-read data in the third read cycle, when the error is detected in the first re-read data at the (B-2); and (C-3) correcting the data stored in the first data cell again at the third read cycle, when the error is detected in the second re-read data. In the operation method of the MRAM as mentioned above, the correction of the reference cell, and the re-correction of the data cell carried out after the correction of the reference cell are carried out during the outputting of the data read from a different data cell by using a different reference cell. Thus, it is possible to correct the reference cell and correct the data cell again without any refusal or inhibition of the access from the outside.

In still another aspect of the present invention, the operation method of the MRAM contains:

(A) reading a data from a data cell in response to a reference signal which is generated by using a reference cell;

(B) performing an error detection on the read data;

(C) writing an input write data into the data cell by using the toggle write;

(D) reading a data from the data cell as a first re-read data after the (C), when an error is detected in the read data;

(E) performing the error detection on the first re-read data;

(F) correcting a data stored in the reference cell, when an error is detected in the first re-read data;

(G) reading a data from the data cell as a second re-read data after the (F), when an error is detected in the first re-read data;

(H) performing the error detection on the second re-read data; and (I) correcting the data stored in the data cell again, when an error is detected in the second re-read data.

According to the foregoing operation method, even if whether a cause of the data error is in the data cell or the reference cell is not known, the data can be correctly written at the high probability under the condition that the data error rate is sufficiently decreased.

In still another aspect of the present invention, the operation method of the MRAM contains:

specifying an address;

reading a data from a selection data cell selected based on the address as a read data by using a selection reference cell selected based on the address;

detecting an error in the read data;

checking whether or not a reference cell address as an address of the selection reference cell is registered in a reference cell address storing unit;

correcting an error in the selection data cell and registering the reference cell address in the reference cell address storing unit, when the reference cell address is not registered in the reference cell address storing unit and when the error is detected in the read data; and correcting the error in the reference cell, when the reference cell address is registered in the reference cell address storing unit and when the error is detected in the read data.

According to the foregoing operation method, even if whether a cause of the data error is in the data cell or the reference cell is not known, the data can be correctly corrected at the high probability under the condition that the data error rate is sufficiently decreased.

The operation method is preferred to further contain removing the reference cell address from the reference cell address storing unit, if the reference cell address is registered in the reference cell address storing unit and if the error is not detected in the read data.

Also, in addition to correcting the error in the reference cell, when the reference cell address is registered in the reference cell address storing unit and when the error is detected in the read data, the following includes:

(A) removing the reference cell address from the reference cell address storing unit;

(B) reading a re-read data from the data cell from which the data is read by using the reference cell;

(C) detecting an error in the re-read data; and (D) correcting the error in the data cell from which the data is read, when the error is detected in the re-read data.

In still another aspect of the present invention, the MRAM includes: a memory array comprising a data cell and a reference cell; and a peripheral circuit configured to read a data from the data cell by using a reference signal generated which is generated using the reference cell and to write a data into the data cell through a toggle write. The peripheral circuit is configured to (A) perform an error detection on the read data read out from the data cell and to correct the data stored in the data cell when an error is detected in the read data; (B) to read the data from the data cell as a first re-read data after the correction of the data cell and to perform the error detection on the first re-read data; (C) to correct a data stored in the reference cell, when an error is detected in the first re-read data; (D) to read the data from the data cell as a second re-read data after the correction of the reference cell and to perform the error detection on the second re-read data; and (E) to correct the data stored in the data cell (17) again, when an error is detected in the second re-read data.

In still another aspect of the present invention, the MRAM contains first to $n^{th}$ data cells (n is an integer equal to or more than 3); first to $n^{th}$ reference cells; and a peripheral circuit comprising first to $n^{th}$ ECC circuits. The peripheral circuit, in a first read cycle, is configured to; (A-1) read data from the first to $n^{th}$ data cells as first to $n^{th}$ read data by using a reference signal which is generated by using the first to $n^{th}$ reference cells, respectively; (A-2) perform an error detection on the first to $n^{th}$ read data by using the first to $n^{th}$ ECC circuits; (A-3) perform an error correction on a first output data of the first to $n^{th}$ read data to output to an external unit; and (A-4) correct the data stored in the first data cell, when an error is detected in the first read data in the first read cycle. Also, the peripheral circuit, in a second read cycle after the first read cycle, is configured to: (B-1) perform an error correction on a second output data of the first to $n^{th}$ read data to output; (B-2) read the data from the first data cell as a first re-read data, when the error is detected in the first read data; (B-3) perform the error detection on the first re-read data; and (B-4) correct the data stored in the first reference cell, when an error is detected in the first re-read data. Moreover, the peripheral circuit, in a third read cycle after the second read cycle, is configured to: (C-1) perform an error correction on a third output data of the first to third read data to output; (C-2) read the data from the first data cell as a second re-read data, when an error is detected in the first re-read data; (C-3) perform an error correction on the second re-read data; and (C-4) correct the data stored in the first data cell again, when the error is detected in the second re-read data.

In still another aspect of the present invention, the MRAM includes: the memory array that includes the data cell and the reference cell; and the peripheral circuit including the reference cell address storing unit. The peripheral circuit is configured to: (A) select a selection reference cell from the reference cells and a selection data cell from the data cells in response to a externally specified address; (B) read a data from the selection data cell by using a reference signal which is generated by using the selection reference cell; (C) perform an error detection on the read data; (D) check whether or not a reference cell address as an address of the selection reference cell is registered in the reference cell address storing unit; (E) to correct an error of selection data cell and register the reference cell address in the reference cell address storing unit, when the reference cell address is not registered in the reference cell address storing unit, and when an error is detected in the read data; and (F) correct an error of the selection reference cell, when the reference cell address is registered in the reference cell address storing unit, and when an error is detected in the read data.

According to the present invention, it is possible to provide the MRAM in which, even if whether a cause of the data error is in the data cell or the reference cell is not known, the data can be correctly corrected at the high probability.

BEST MODE FOR CARRYING OUT THE INVENTION

First Exemplary Embodiment

Entire Configuration

Figure 6:
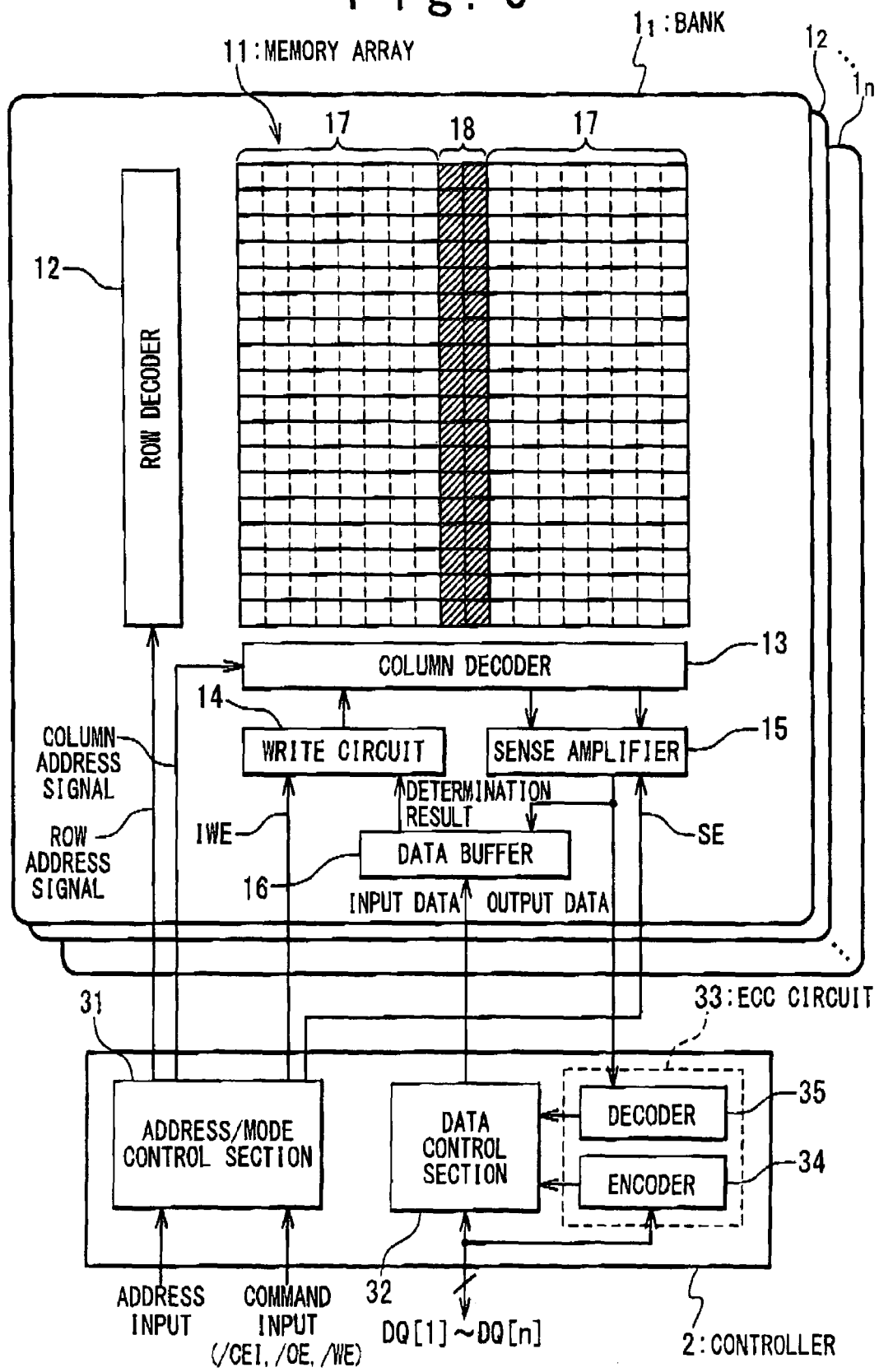
FIG. 6 is a block diagram showing a configuration of a MRAM according to a first exemplary embodiment of the present invention.

FIG. 6 is a block diagram showing a configuration of a MRAM according to a first exemplary embodiment of the present invention. The MRAM according to this exemplary embodiment contains n banks $1_1$ to $1_n$ and a controller 2. The banks $1_1$ to $1_n$ are related to data input/outputs DQ[1] to DQ[n], respectively. The banks $1_1$ to $1_n$ store the data received from the corresponding data input/outputs DQ[1] to DQ[n]. In addition, the data stored in the banks $1_1$ to $1_n$ are outputted from the corresponding data input/outputs DQ[1] to DQ[n] to outside. The controller 2 functions as an interface between the data input/outputs DQ[1] to DQ[n] and the banks $1_1$ to $1_n$ and also carries out the process with regard to the error correction. The banks $1_1$ to $1_n$ and the controller 2 will be described below in detail.

Each of the banks $1_1$ to $1_n$ contains a memory array 11, a row decoder 12, a column decoder 13, a write circuit 14, a sense amplifier 15 and a data buffer/comparator 16. The memory cells composed of magneto-resistance elements are arranged in a matrix in the memory array 11. The row decoder 12 and the column decoder 13 are intended to select one of the memory cells. The row decoder 12 is used to select one row of the memory cells, and the column decoder 13 is used to select one column of the memory cells. The write circuit 14 generates a write current to write the data into a selection memory cell at the time of a write operation. As described later, the write operation of the data into the selection memory cell is carried out in a toggle write. The sense amplifier 15 determines the data of the selection memory cell and generates the read data.

When the toggle write is carried out, the data buffer/comparator 16 determines whether or not the data in the selection memory cell should be reversed, and generates a determination result signal indicating a determination result. Specifically, the data buffer/comparator 16 receives the data written in the selection memory cell from the sense amplifier 15 and compares the received data and a write data written into the selection memory cell. If they are not coincident, the data buffer/comparator 16 activates the determination result signal and allows the write circuit 14 to generate the write current. If they are coincident, the data buffer/comparator 16 deactivates the determination result signal. In this case, the data in the selection memory cell is not reversed. Specifically, a data buffer built in the data buffer/comparator 16 stores the read data outputted from the sense amplifier 15 and the write data inputted externally in a temporal storing unit. The comparator is form from an exclusive-OR gate for comparing the coincidence/non-coincidence between the received data and the write data inputted externally.

Figure 1:
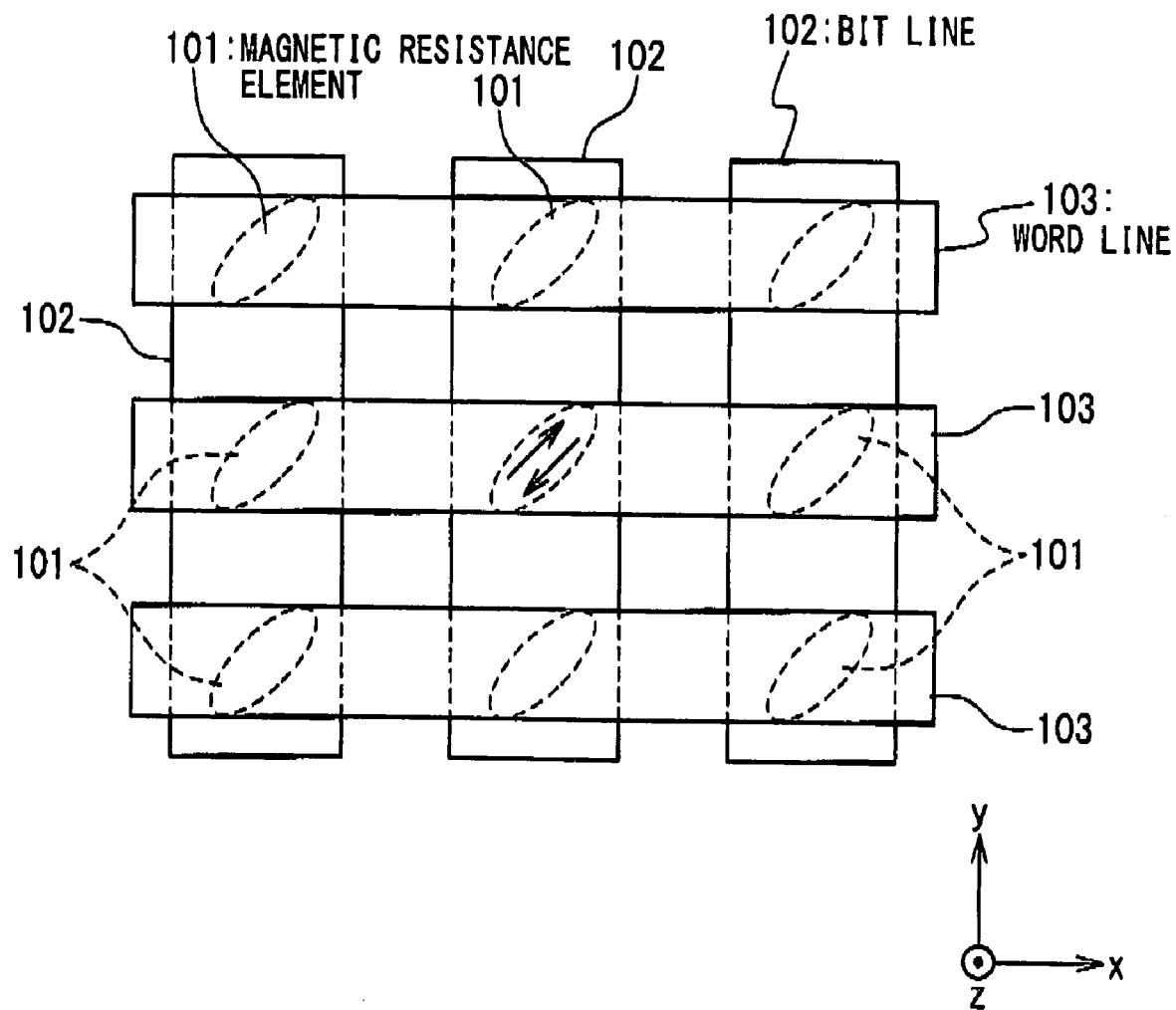
FIG. 1 is a plan view showing a typical configuration of an MRAM employing a toggle write in a related art.
Figure 2:
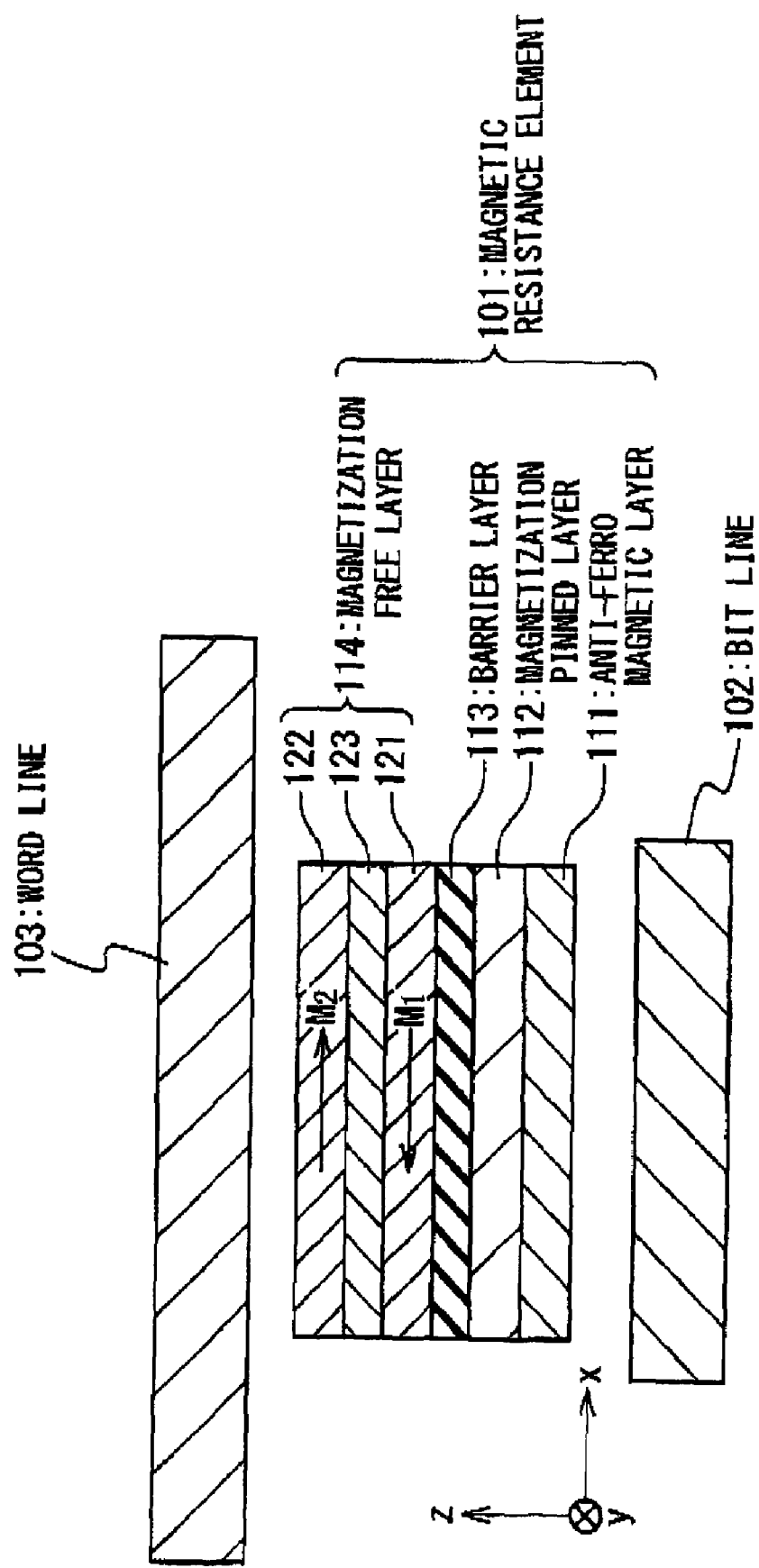
FIG. 2 is a sectional view showing the configuration of a memory cell in the MRAM corresponding to the toggle write in the related art.
Figure 3:
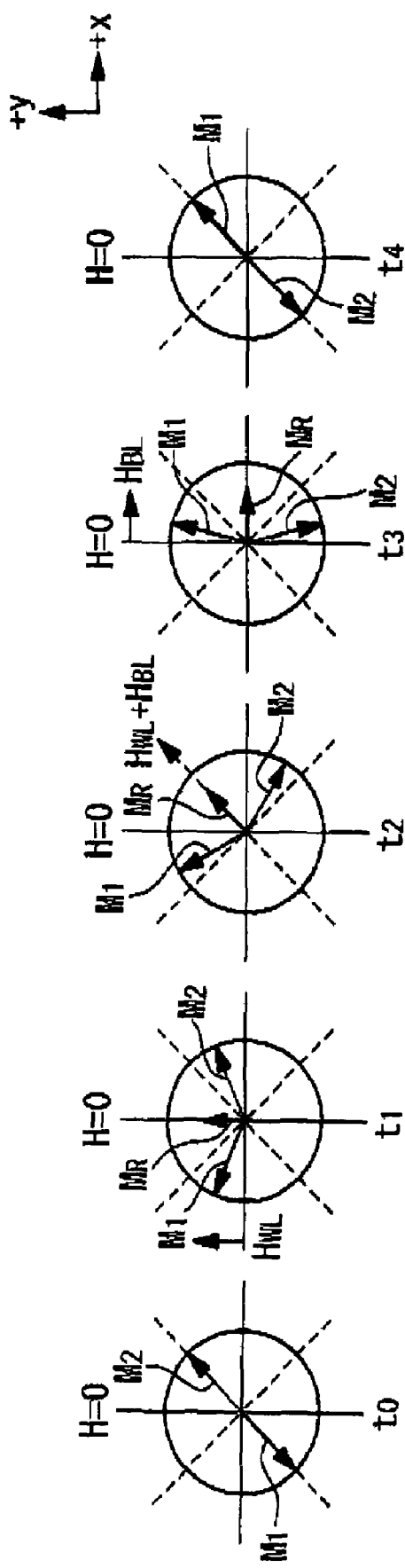
FIG. 3 is conceptual views showing a procedure of the toggle write in the related art.
Figure 4:
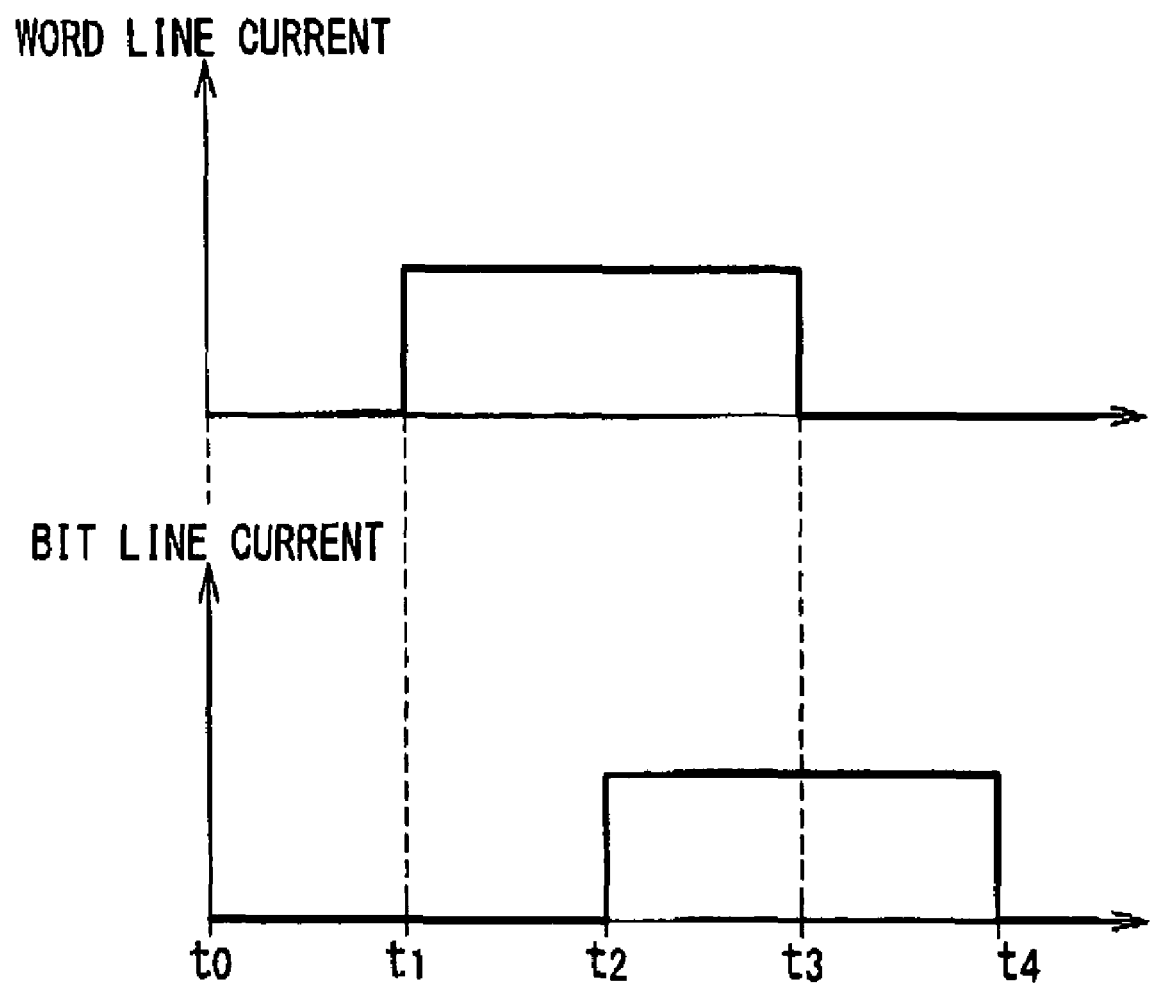
FIG. 4 is diagrams showing the waveforms of current on a word line current and a bit line current in the related art.
Figure 5:
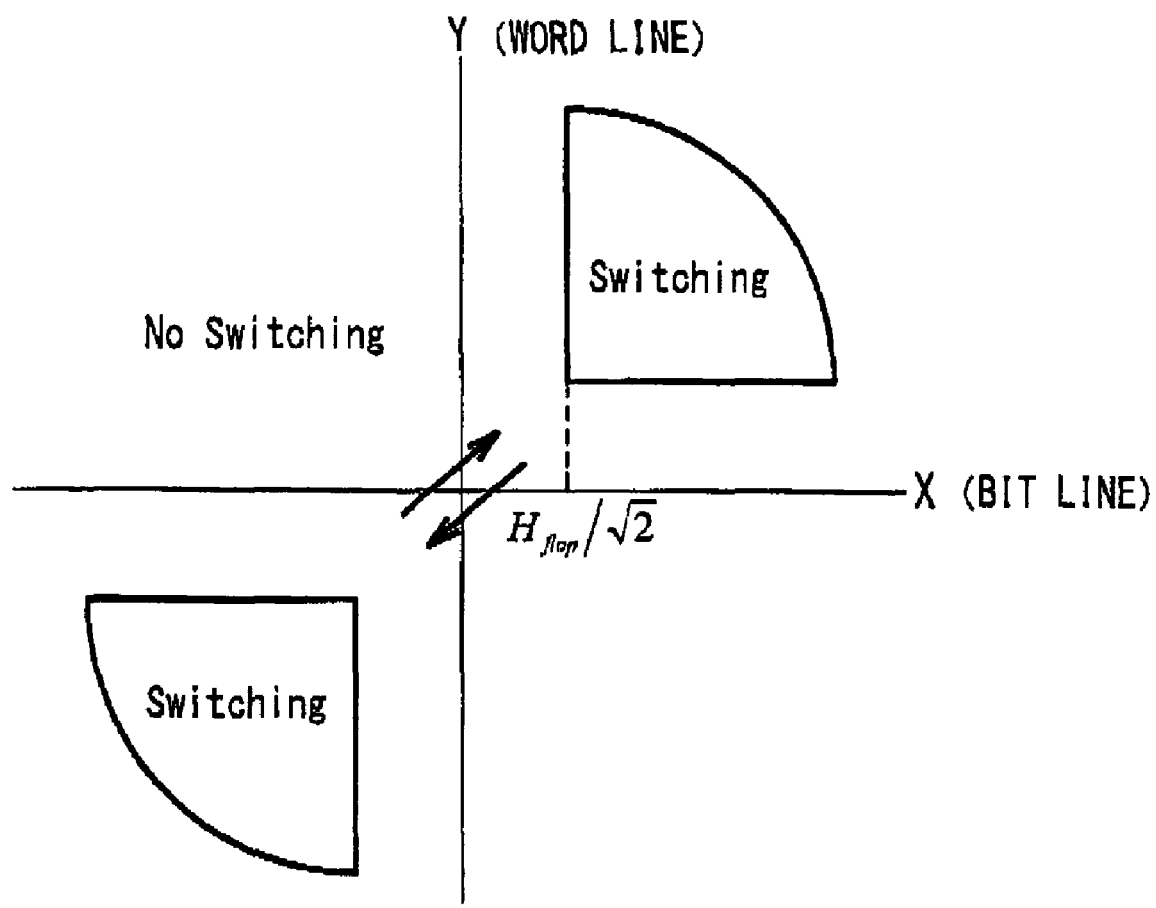
FIG. 5 is a graph showing a region where the write operation of the MRAM can be carried out in the toggle write.
Figure 7A:
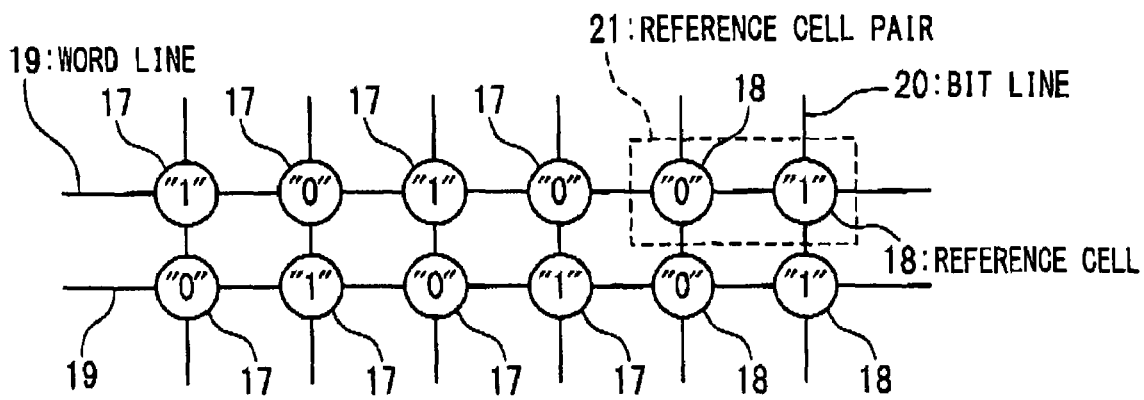
FIG. 7A is a diagram showing an arrangement of memory cells.
Figure 7B:
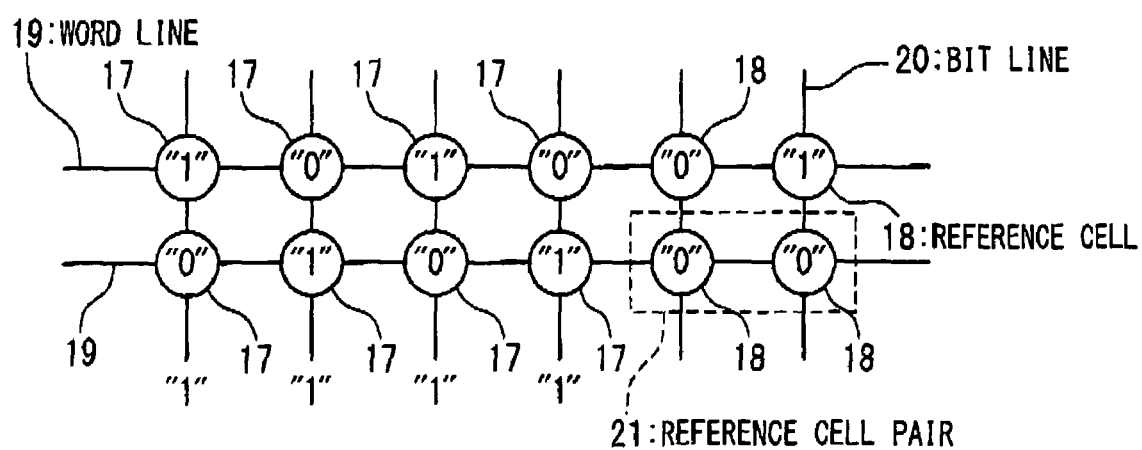
FIG. 7B is a conceptual diagram showing the operation of the MRAM, when an erroneous data is held in a reference cell.

FIGS. 7A and 7B are diagrams showing the configuration of the memory array in detail. The memory array 11 contains word lines 19 and bit lines 20 and the memory cells provided at the intersections of them. In the memory cells arranged in the memory array 11, there are two kinds of data cells 17 and reference cells 18. The structures of the data cell 17 and the reference cell 18 are similar to the structure of the magneto-resistance element 101 shown in FIG. 2. When the write operations into the data cell 17 and the reference cell 18 are carried out, the write currents are supplied to the word lines 19 and bit lines 20 corresponding to the cells The data cell 17 is a memory cell in which the data is actually stored. The data on which error correction encoding is carried out is held in the data cell 17. In this exemplary embodiment, the data cells 17 for storing the bits of a same error correction code are positioned on the same row. As the error correction code, for example, block codes such as a humming code, a BCH code and a read Solomon code are preferably used.

On the other hand, the reference cell 18 is a memory cell that is used to generate a reference signal used to read the data from the data cell 17. The reference cells 18 are arrayed in two columns on the center of the memory array 11. That is, as shown in FIG. 7A, the two reference cells 18 are provided on one row of memory cells. The two reference cells 18 in the same row are hereinafter referred to as a reference cell pair 21. It should be noted that the data "0" is written into one of the two reference cells 18 of the reference cell pair 21, and the data "1" is written into the other. As described later, when the data cell 17 on a memory cell row is read, the two reference cells 18 located on the memory cell row are used.

The fact that one of the two reference cells 18 of the reference cell pair 21 holds the data "0" and the other holds the data "1" is important in order to correctly perform the read operation from the data cell 17. As shown in FIG. 7B, when both of the reference cells 18 of the reference cell pair 21 are assumed to hold the data "0", the data stored in the corresponding data cell 17 is easily determined to be the data "1".

The controller 2 contains an address/mode control section 31, a data control section 32 and an ECC circuit 33. The address/mode control section 31 responds to an address input and a command input and generates various internal control signals such as a row address signal, a column address signal, an internal write enable signal IWE and a sense enable signal SE. The command input includes, for example, a chip enable signal/CE1, an output enable signal /OE, and a write enable signal /WE. The symbol "/" implies that the signal is low active. The data control section 32 functions as the data interface between the data input outputs DQ[1] to DQ[n] and the banks $1_1$ to $1_n$ and the ECC circuit 33. The ECC circuit 33 carries out the calculation for the error correction. The ECC circuit 33 contains an encoder 34 for performing the error correction encoding, and a decoder 35 for performing decoding and error detection.

(Error Correction at Time of Read Operation)

One feature of the read operation of the MRAM in this exemplary embodiment lies in a mechanism that, when an error is detected in a read data, the data in the data cell 17 is firstly unconditionally corrected (namely, the data is reversed), and when the data error is not solved thereafter, the correction of the data in the reference cell 18 and the re-reversal of the data in the data cell 17 are carried out. In the MRAM in this exemplary embodiment, whether the cause of the read error is in the data cell 17 or the reference cell 18 is not determined prior to the data correction in the data cell 17. Certainly, if the data bit read out from the data cell 17 is analyzed, whether the cause of the read error is in the data cell 17 or the reference cell 18 may be determined to some extent. For example, in case of the generation of the single-bit error, there is a high possibility that an error is in the data cell 17, and in case of the generation of a burst error, there is a high possibility that an error is in the reference cell 18. However, the possibility that the error is generated in the reference cell 18 even in the case of the single-bit error cannot be denied depending on the property of the reference cell 18.

According to the read operation of the MRAM in this exemplary embodiment as mentioned above, under the condition that the generation probability of a write error and a software error is sufficiently suppressed (specifically, under the condition that it is suppressed to the level in which the data error exists only in one of the data cell 17 and the reference cell 18 to which the read operation is carried out), the error correction can be correctly carried out.

Figure 8:
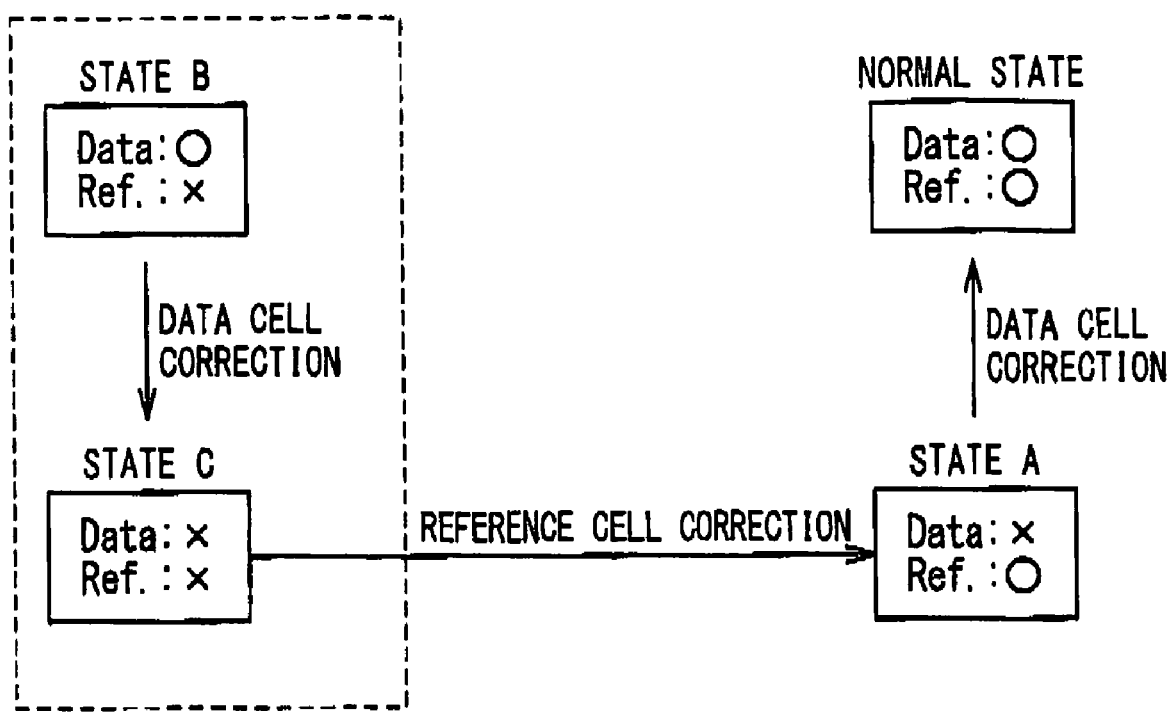
FIG. 8 is a state transition diagram at a time of a read operation in the MRAM according to the first exemplary embodiment.

This would be understood from the state transition diagram shown in FIG. 8. If a data error exists only in one of the data cell 17 and the reference cell 18 to which the read operation is carried out, the MRAM has either of the following two states of: a state A in which the data error exists only in the data cell 17; and a state B in which the data error exists only in the reference cell 18. Whether the MRAM is in the state A or the state B cannot be fully determined basically.

In this exemplary embodiment, at first, the data in the data cell 17 is unconditionally corrected. Thus, if the MRAM is in the state A, the MRAM is transited to the normal state (namely, both of the data in the data cell 17 and reference cell 18 are in the normal state), and if the MRAM is in the state B, the MRAM is transited to a state C in which both of the data cell 17 and reference cell 18 are erroneous.

Subsequently, the data is again read out from the data cell 17, and the error detecting operation of the data in the data cell 17 is carried out. If the MRAM is already returned to the normal state, the data error is not detected.

On the other hand, if the MRAM is undesirably already transited to the state C, the data error is detected. In this case, the data in the reference cell 18 is corrected. Moreover, the data in the data cell 17 is again corrected.

In this way, in the MRAM in this exemplary embodiment, even when the MRAM is in any of the state A and the state B (under the condition that it is suppressed to the level in which the data error exists only in one of the data cell 17 and the reference cell 18 to which the read operation is carried out), the data can be finally returned to the normal state.

Figure 9:
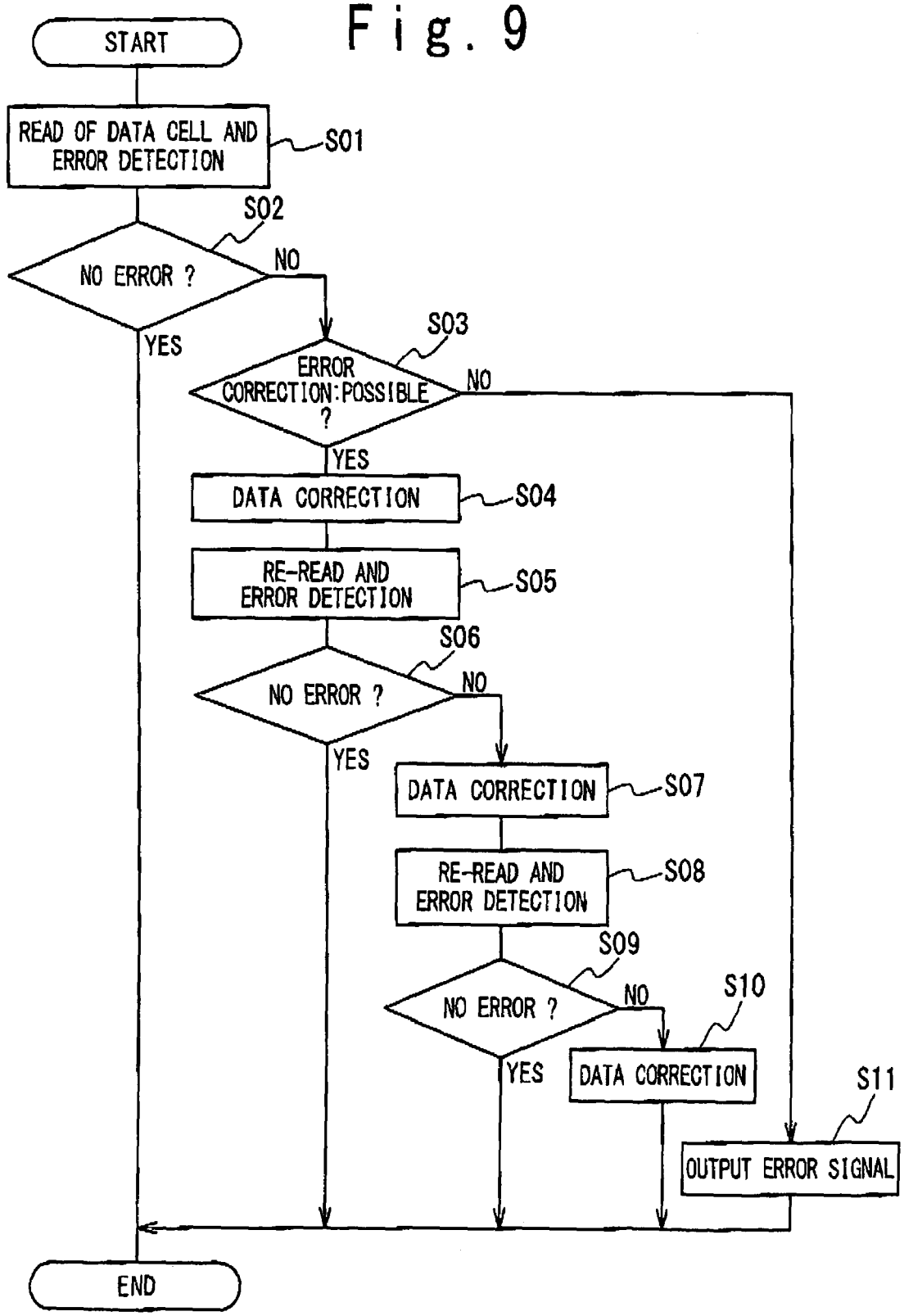
FIG. 9 is a flowchart showing a procedure of an operation of the MRAM according to the first exemplary embodiment.

A specific procedure of the read operation of the MRAM in this exemplary embodiment will be described below with reference to FIG. 9. As shown in FIG. 9, in the read operation of the MRAM in this exemplary embodiment, the read operation from the data cell 17 and the error detection are firstly carried out (Step S01).

The data read operation from the data cell 17 is carried out as follows. The data cell 17 corresponding to one error correction code is selected in response to an address input. At this time, simultaneously, the reference cell 18 located on the same row as the selected data cell 17 is also selected. Subsequently, the data bit is read out from the selected data cell 17.

When the data bit is read out from the selected data cell 17, the two reference cells 18 located on the same row as the data cell 17 are used. Specifically, an average of currents flowing through the two reference cells 18 and a current flowing through the data cell 17 are compared by the sense amplifier 15, and the data bit of the data cell 17 is determined. The data bit of the data cell 17 read out in this way is supplied to the decoder 35, and the error detection is carried out thereon. In the exemplary embodiment, the ECC circuit 33 calculates a syndrome from the read data bit and carries out the error detection in accordance with the syndrome.

If the error is not detected, the data read out from the target data cell is outputted as the output data (Step S02).

On the other hand, if an error is detected, the ECC circuit 33 determines whether or not the error correction is possible (Step S03). If determining that the error correction is impossible, the ECC circuit 33 outputs an error signal to the outside (Step S11). The read operation is stopped consequently.

If determining that the error correction is possible, the ECC circuit 33 outputs the correct data to the outside. Moreover, under the control of the ECC circuit 33, the data stored in the data cell 17 is corrected (Step S04). That is, of the selected data cells 17, the data in the data cell 17 in which the data error is detected is reversed. The reversal of the data is carried out by the foregoing toggle write.

Subsequently, the data is again read out from the selected data cell 17, and the error detection is further carried out by the ECC circuit 33 (Step S05). If the error is not detected (Step S06), the read operation is completed. This implies that the MRAM in this exemplary embodiment is originally in the state A in FIG. 8 and is returned to the normal state by correcting the data.

On the other hand, if the error is detected at the step S05, the reference cell 18 is corrected. The fact that the error is detected at the step S05 implies that the MRAM is transited to the state C through the data correction at the step S04, and the MRAM is transited to the state A through the correction of the reference cell 18.

The correction of the reference cell 18 is carried out by reversing the data in one of reference cells 18 of the reference cell pair 21 related to the data error. A case that the reference cell 18 should be corrected is a case that both of the data in the reference cells 18 of the reference cell pair 21 are the data "0" or the data "1". Thus, by reversing the data in the one reference cell 18 that is arbitrarily selected, the reference cell 18 of the reference cell pair 21 related to the data error can be returned to the state that can be used for the data read operation.

After the correction of the reference cell 18, the data is again read out from the selected data cell 17, and the error detection is further carried out by the ECC circuit 33 (Step S08). Since the MRAM ought to be transited to the state A, through the correction of the reference cell 18, the error ought to be basically detected. If the error is detected (Step S09), the data cell 17 is again corrected (Step S10). Consequently, the MRAM is returned to the normal state. If the error cannot be detected due to any cause, the read operation is completed in its original state. For example, if the data errors are originally in both of the data cell 17 and the reference cell 18, there is a case that the data error is not detected at the step S08.

Figure 10:
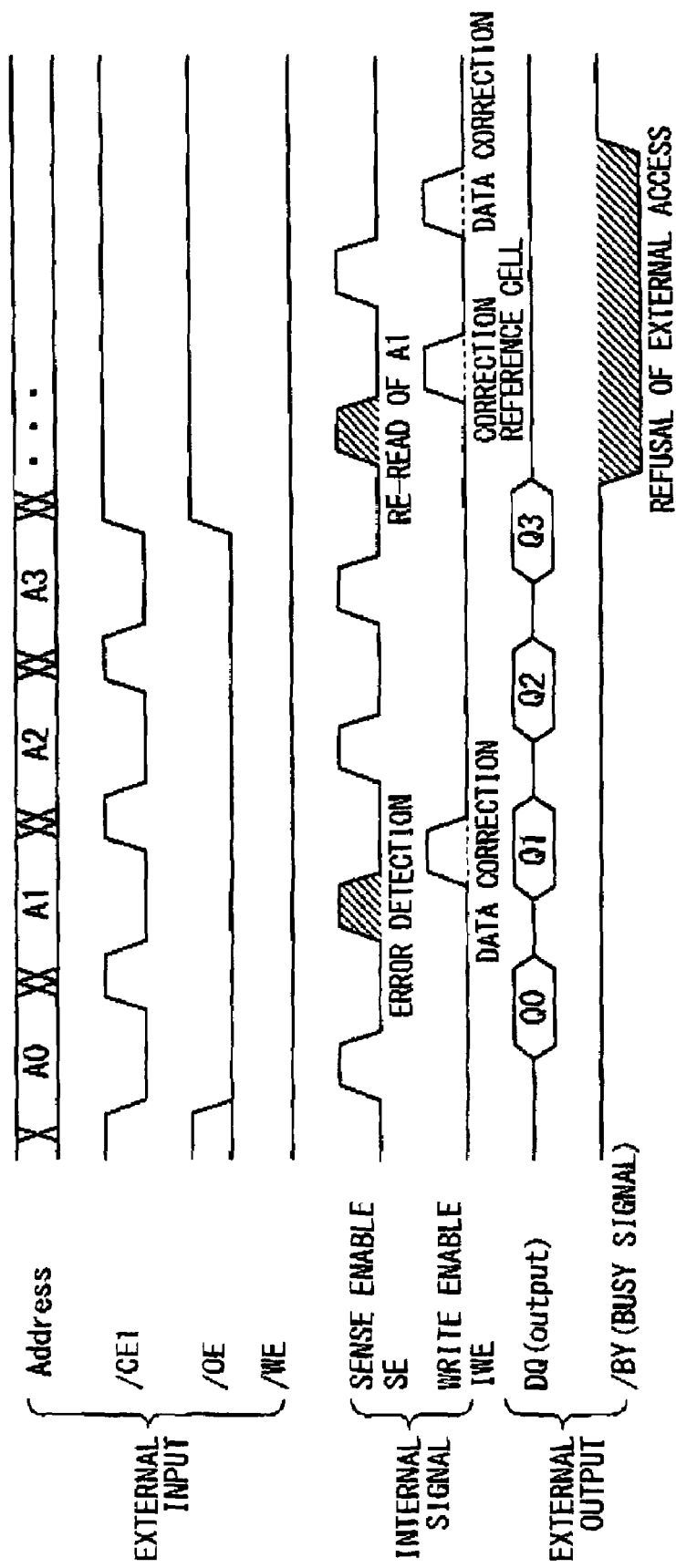
FIG. 10 is timing charts showing an example of a read operation of the MRAM according to the first exemplary embodiment.

FIG. 10 is timing charts showing one example of the operation timings when the read operation to a series of addresses A0 to A3 is carried out in the foregoing procedure. Here, the MRAM in this exemplary embodiment is assumed to be accessed for every address group, and the addresses A0 to A3 produce one address group. At first, an output enable signal /OE is activated. Moreover, addresses are sequentially supplied to the MRAM from the outside. Moreover, a chip enable signal /CE1 is activated in synchronization with the supply of the address. The data cell 17 is selected in response to the address input. Moreover, a sense enable signal /SE is activated in synchronization with the activation of the chip enable signal /CE1. In response to the activation of the sense enable signal /SE, the sense amplifier 15 reads the data from the selected data cell 17. The read data is supplied to the ECC circuit 33, and the error detection is carried out thereon.

If an error is not detected, the data read out from the data cell 17 is outputted in its original state as the output data. The operation example of FIG. 10 shows a case when any error is not detected in the data corresponding to the addresses A0, A2 and A3. In FIG. 10, attention should be paid to the fact that the output data corresponding to the addresses A0, A2 and A3 are noted as Q0, Q2 and Q3, respectively.

If an error is in the read data, the error correction is carried out on the read data, and the data after the error is corrected is outputted to the outside. The operation example of FIG. 10 shows a case that the error is detected in the data corresponding to the address A1. The output data corresponding to the address A1 is noted as Q1 in FIG. 10. The output data Q1 is not the data read from the data cell 17, and this is the data after the error correction. If any error is in the read data, the internal write enable signal IWE is further activated, and the error correction is carried out on the data stored in the data cell 17.

The re-reading and error detection of the data carried out after the error correction of the data in the data cell 17 (Step S05) and the correction of the reference cell 18 (Step S07) are carried out after the completion of the read operation from the data cells 17 corresponding to the series of addresses A0 to A3. This is important in order to correspond to a burst read. When a re-read operation and error detection of the data and the correction of the reference cell 18 that is subsequently carried out are tried in the read cycle in which the data read operation from the data cell 17 in which error is detected is carried out, the time period of the read cycle is required to be made long. This is not preferred because this obstructs the burst read.

After the completion of the burst read from the data cells 17 corresponding to the addresses A0 to A3, the output enable signal /OE is deactivated. Moreover, the ECC circuit 33 responds to the fact that the error is detected in the address A1, to activate a busy signal /BY and then to inhibit the access from the outside. This is because, when there is a necessity, the reference cell 18 is corrected to further re-correct the data cell 17. During the operation for correcting the reference cell 18, the access from the outside is impossible. If the error is not detected, the busy signal /BY still remain in the inactive state.

When the busy signal /BY is activated, the sense amplification enable signal SE is firstly activated, and the data is again read from the data cell 17 corresponding to the address A1 from which the error is detected. The error detection is carried out on the read data. When any error is detected, the internal write enable signal IWE is again activated to correct the error in the reference cell 18. Subsequently, the sense amplification enable signal SE is again activated, and the data is further again read from the data cell 17 corresponding to the address A1 from which the error is detected. When the error is detected (at this stage, the error ought to be detected), the data in the data cell 17 is corrected. After that, the busy signal /BY is deactivated, and the read operation is completed.

(Error Correction at Time of Write Operation)

As mentioned above, in the toggle write, the data read operation is carried out prior to the data write operation. When the data in the data cell 17 is erroneous, the error in the data cell 17 can be automatically corrected by carrying out the write operation. However, when the data stored in the reference cell 18 is erroneous, the erroneous data is read from the target memory cell in this data read operation. As a result, there is a possibility that the erroneous data is written into the target memory cell. Thus, in the toggle write, it is important that, even if the data stored in the reference cell 18 is erroneous, the data can be correctly written.

One considered approach is to analyze the data stored in the data cell 17 and detect whether or not any data error is in the reference cell 18. However, as mentioned above, the possibility that the error is generated in the reference cell 18 even in case of the single-bit error cannot be denied, depending on the property of the reference cell 18.

In the MRAM in this exemplary embodiment, the error detection is carried out in the data read operation prior to the write operation. Irrespectively of the result, the wiring operation is firstly carried out without any correction of the reference cell. Then, the error detection is again carried out after the write operation. When the data errors are detected in both of the case prior to the write operation and the case after the write operation, the data in the reference cell 18 is corrected. In this case, the data stored in the data cell 17 is also erroneously written. Thus, the data correction is also carried out on the data cell 17.

According to such an operation, under the condition that the generation probability of the write error and software error is sufficiently suppressed (specifically, under the condition that it is suppressed to the level in which the data error exists only in one of the data cell 17 and reference cell 18 to which the read operation is carried out), the data write operation can be correctly carried out.

Figure 11:
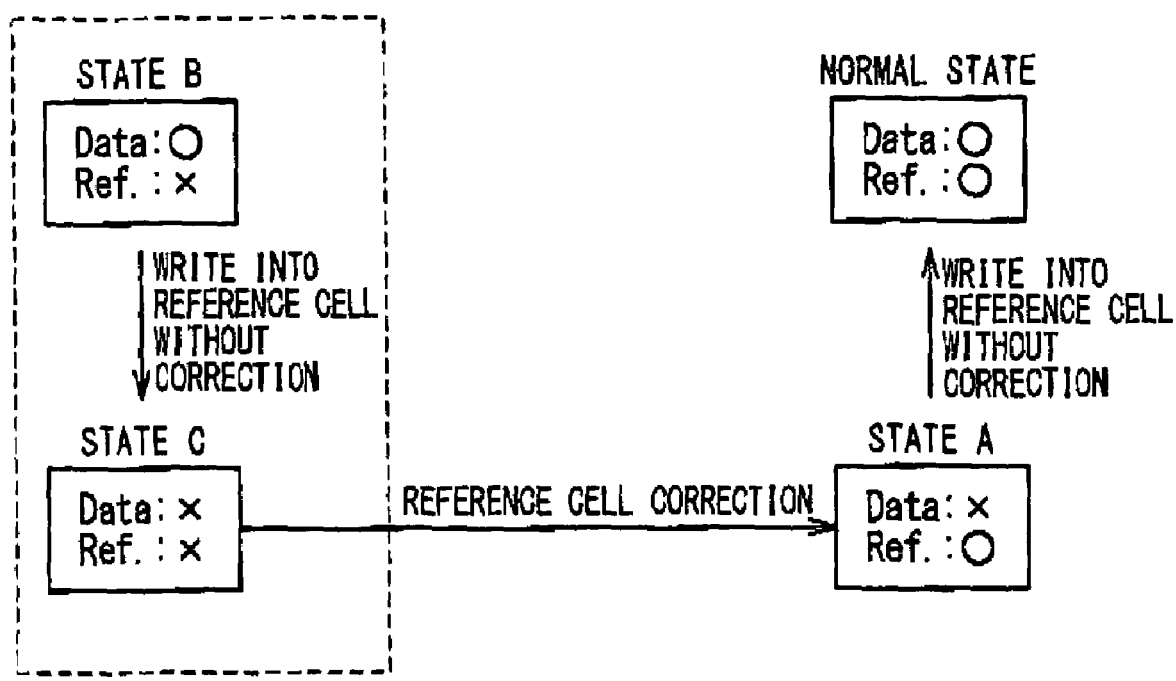
FIG. 11 is a state transition diagram at a time of a write operation of the MRAM according to the first exemplary embodiment.

This fact would be understood from the state transition diagram shown in FIG. 11. If the data error exists only in one of the data cell 17 and reference cell 18 to which the read operation is carried out, the MRAM has the following two states of: a state A in which the data error exists only in the data cell 17; and a state B in which the data error exists only in the reference cell 18. Whether the MRAM is in the state A or the state B cannot be fully determined basically.

In this exemplary embodiment, at first, the write operation into the data cell 17 is unconditionally carried out. Thus, through the write operation to the data cell 17, if the MRAM is in the state A, the MRAM is transited to the normal state (namely, both of the data in the data cell 17 and reference cell 18 are in the normal state), and if the MRAM is in the state B, the MRAM is transited to the state C in which both of the data cell 17 and reference cell 18 are erroneous.

Subsequently, the data is again read from the data cell 17, and the error detection of the data in the data cell 17 is carried out. If the MRAM is already returned to the normal state, the data error is not detected.

On the other hand, if the MRAM is undesirably already transited to the state C, the data error is detected. In this case, the data in the reference cell 18 is corrected. Moreover, the data write operation into the data cell 17 is again carried out. Thus, the MRAM can be returned to the normal state.

Figure 12:
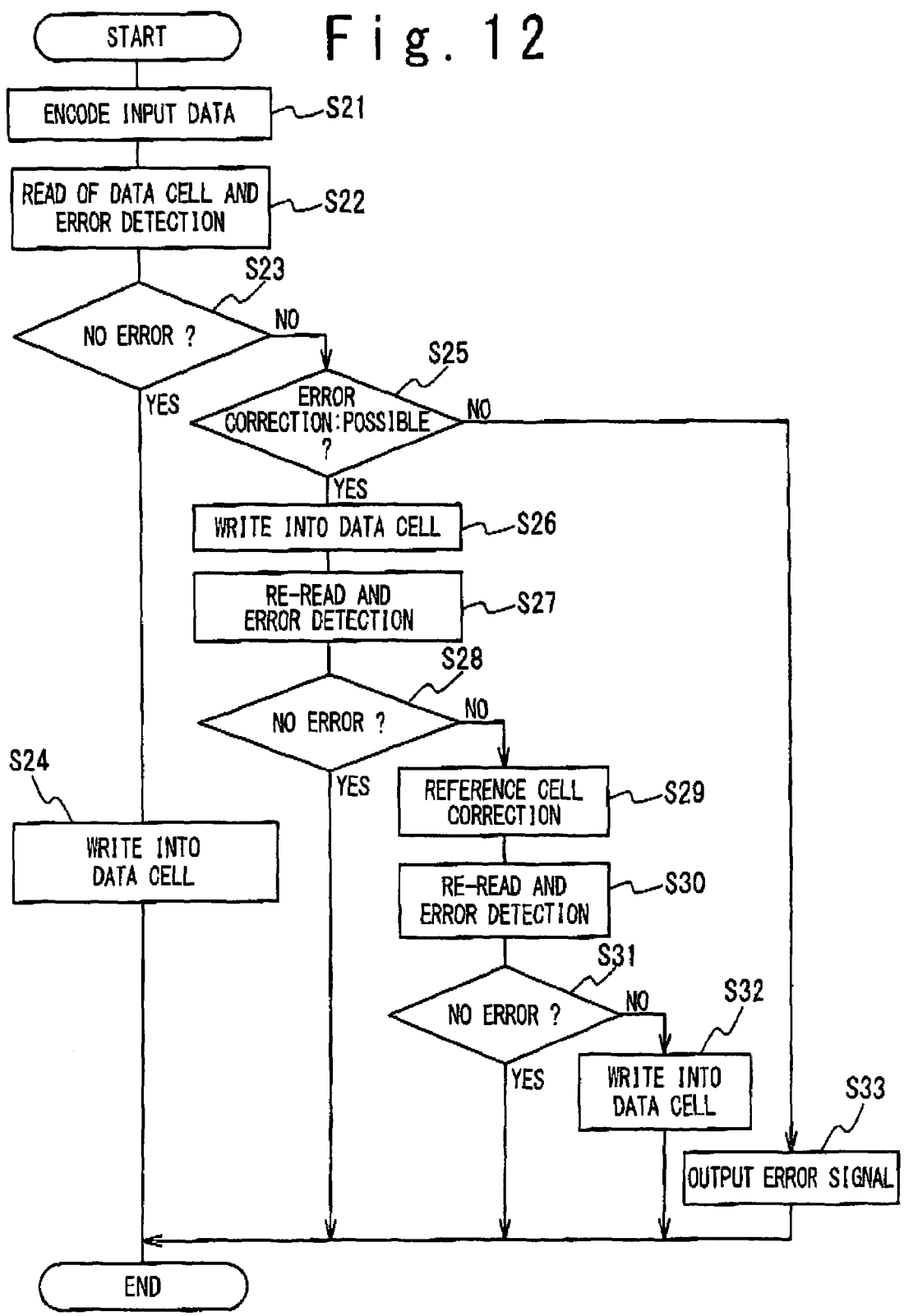
FIG. 12 is a flowchart showing a procedure of a write operation of the MRAM according to the first exemplary embodiment.

A specific procedure of the write operation into the MRAM in this exemplary embodiment will be described below with reference to FIG. 12. As shown in FIG. 12, in the write operation into the MRAM in this exemplary embodiment, an input write data is firstly encoded by the encoder in the ECC circuit 33 (Step S21).

Subsequently the read operation of the data from the data cell 17 and the error detection are carried out (Step S22). The procedures of the read operation of the data and the error detection are similar to the procedure carried out at the step 01 at the time of the read operation.

If the error is not detected (Step S23), the encoded write data is written to the selected data cell 17 (Step S24).

On the other hand, if the error is detected, the ECC circuit 33 determines whether or not the error correction is possible (Step S25). If determining that the error correction is impossible, the ECC circuit 33 outputs an error signal to the outside (Step S33). The write operation is stopped consequently.

If determining that the error correction is possible, the ECC circuit 33 outputs the correct data to the outside. Moreover, the write data is written into the selected data cell 17 (Step S26). The write operation of the write data is carried out by the toggle write.

Subsequently, the data is again read from the selected data cell 17, and the error detection is further carried out by the ECC circuit 33 (Step S27). If the error is not detected (Step S28), the write operation is completed. This implies that the MRAM in this exemplary embodiment is originally in the state A in FIG. 11 and is returned to the normal state through the data write operation.

On the other hand, if the error is detected at the step S28, the reference cell 18 is corrected. The fact that the error is detected at the step S28 implies that the MRAM is transited to the state C through the data write operation at the step S26, and the MRAM is transited to the state A through the correction of the reference cell 18.

After the correction of the reference cell 18, the data is again read from the selected data cell 17, and the error detection is further carried out by the ECC circuit 33 (Step S30). Since through the correction of the reference cell 18, the MRAM ought to be transited to the state A, any error ought to be basically detected. If the error is detected (Step S31), a write operation into the data cell 17 is again carried out (Step S32). Consequently, the MRAM is returned to the normal state. If the error cannot be detected due to any cause, the write operation is completed in its original state. For example, if data errors are originally in both of the data cell 17 and the reference cell 18, there is a case that the data error is not detected at the step S30.

As mentioned above, in the MRAM in this exemplary embodiment, under the condition that the generation probability of the write error and software error is sufficiently suppressed, the write operation can be correctly carried out, even when whether the data error exists in the data cell 17 or the reference cell 18 is not known.

Second Exemplary Embodiment

One problem in the configuration of the MRAM according to the first exemplary embodiment lies in the necessity of refusal of an external access during the error correction of the reference cell 18 and the re-correction of the data cell 17, as understood from FIG. 10. This is not preferable because this reduces the compatibility with a different memory device. For example, when the MRAM is operated as a DRAM compatibility memory, the reference cell 18 may be corrected at a refresh timing of the DRAM. In this case, a busy signal /BY may be outputted to the MRAM in correspondence to the fact that the DRAM outputs a refresh signal. However, the MRAM according to the first exemplary embodiment cannot cope with a rule that the function for refusal of the external access is not given to the memory device, such as a SRAM rule.

In order to cope with such a problem, in the MRAM according to the second exemplary embodiment, the error correction of a reference cell 18 is carried out in the read cycle, in which the data in the data cell 17 to which the data read operation is carried out without any use of the reference cell 18 is outputted to the outside. Thus, when being viewed from the outside, the data error in the reference cell 18 can be corrected without any inhibition of the access. The MRAM according to the second exemplary embodiment will be described below in detail.

Figure 13:
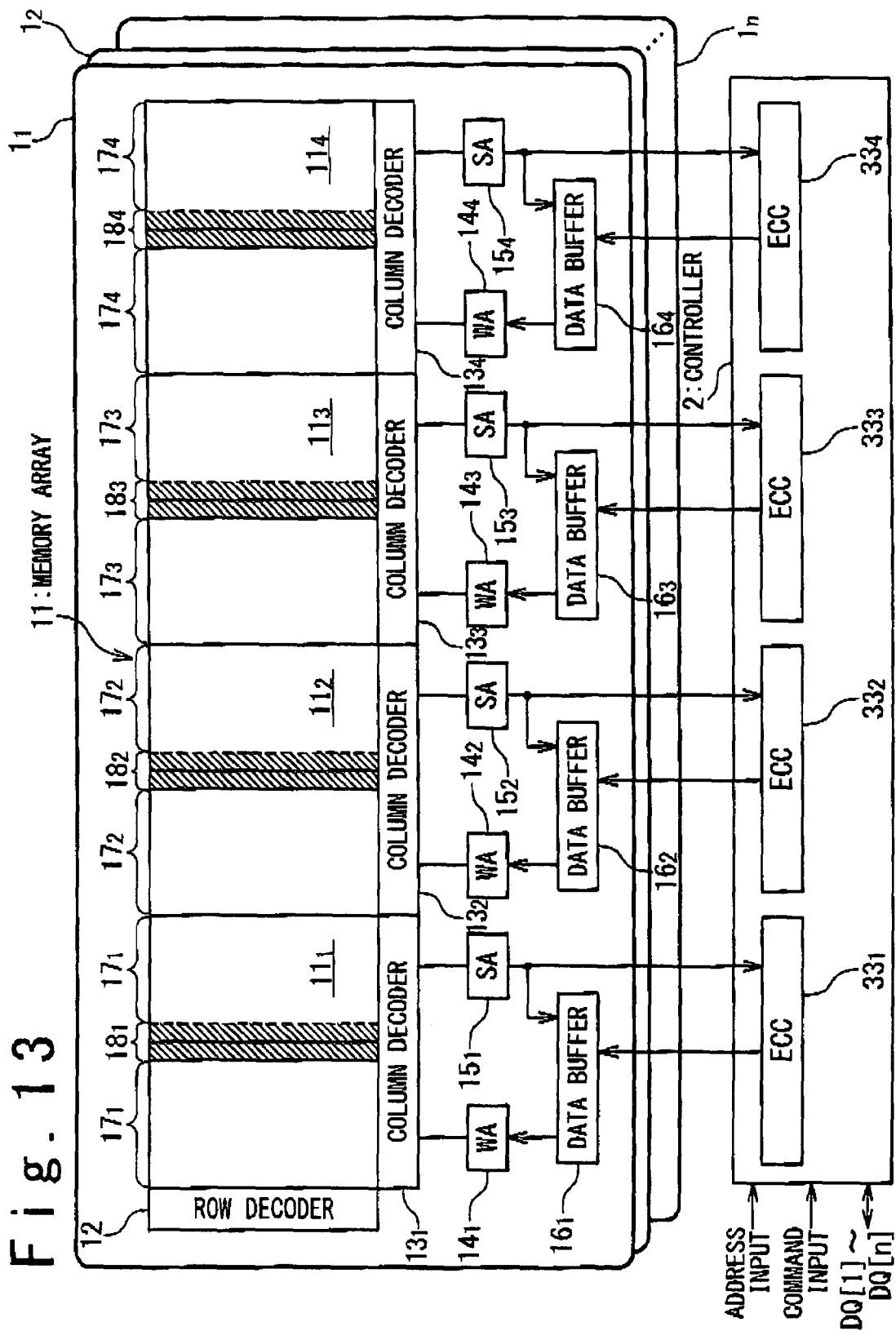
FIG. 13 is a block diagram showing the configuration of the MRAM according to a second exemplary embodiment of the present invention.

FIG. 13 is a block diagram showing the configuration of the MRAM according to the second exemplary embodiment of the present invention. The second exemplary embodiment is designed such that the memory array 11 in each bank 1 is divided into a plurality of blocks $11_1$ to $11_4$, which can be accessed independently of each other. Specifically, the reference cells $18_1$ to $18_4$ of two columns are provided in the blocks $11_1$ to $11_4$, respectively. In a read operation from the data cell $17_i$ of the block $11_i$, the reference cell $18_i$ in the same block is used. Moreover, the plurality of column decoders $13_1$ to $13_4$, the plurality of write circuits $14_1$ to $14_4$ and the plurality of sense amplifiers $15_1$ to $15_4$ are provided for the respective banks $1_1$ to $1_n$. In accessing the block $11_i$, the column decoder $13_i$, the write circuit $14_i$, the sense amplifier $15_i$ and the data buffer/comparator $16_i$ are used. The ECC circuits $33_i$ to $33_4$ whose number is equal to the number of the blocks per bank are provided in the controller 2. The ECC circuits $33_1$ to $33_4$ are used to perform the error correction on the blocks $11_1$ to $11_4$, respectively.

Figure 14:
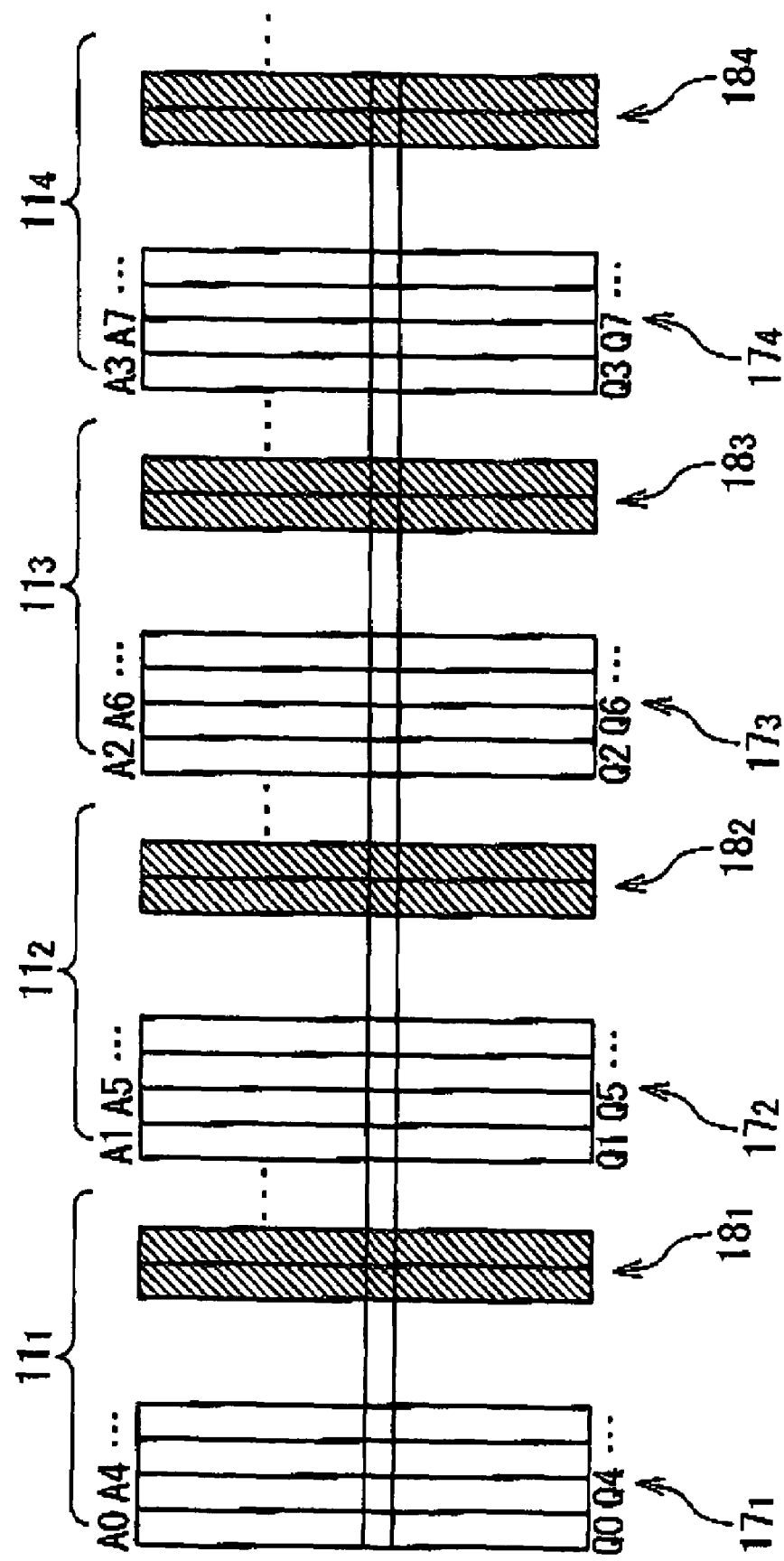
FIG. 14 is a diagram showing an address arrangement of the memory arrays according to the second exemplary embodiment.

In this exemplary embodiment, in order to perform the error correction on one reference cell 18 during the data read from the data cell 17 without any use of the reference cell 18, the special address assignment is defined for the memory array 11. FIG. 14 is a diagram showing an address arrangement of the memory arrays 11 in this exemplary embodiment. Four continuous column addresses are assigned to the different blocks $11_1$ to $11_4$. For example, the addresses A0 to A3 are assigned to the blocks $11_1$ to $11_4$, respectively. The addresses A4 to A7 are similar.

As described later, the read operation of the MRAM in this exemplary embodiment is carried out for each address group composed of four continuous addresses. Also, a type may be used in which the foregoing continuous addresses correspond to the burst address and are used for a well-known burst operation.

Figure 15:
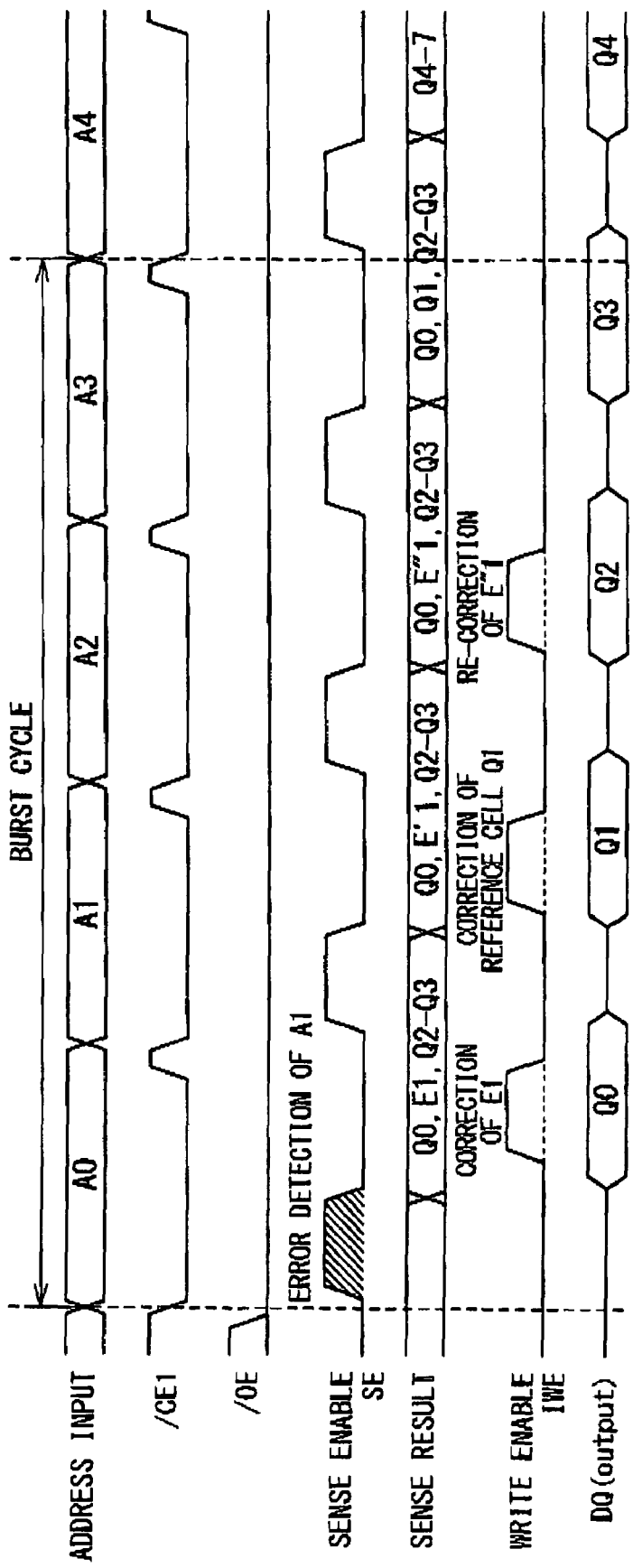
FIG. 15 is timing charts showing an example of the read operation of the MRAM according to the second exemplary embodiment.

FIG. 15 is timing charts showing an example of the read operation of the MRAM according to the second exemplary embodiment. Specifically, FIG. 15 shows a burst read to the addresses A0 to A3 when the data error exists in the reference cell $18_2$ used to read the data in the address A1. The fact that the data error exists in the reference cell 18 implies that the MRAM is initially in the state B in FIG. 8. It should be noted that in FIG. 15, Q0 to Q3 are the read data corresponding to the addresses A0 to A3, respectively.

A chip enable signal /CE1 and an output enable signal /OE are activated, and a first read cycle is started. In the first read cycle, the address A0 is given as an address input. Subsequently, a sense enable SE is activated, and data are read from the data cells 17 corresponding to each of the addresses A0 to A3. It should be noted that even when only the address A0 is given as the address input, the data of the addresses A0 to A3 belonging to the same address group are read. According to the configuration of FIG. 13 in which the addresses A0 to A3 are assigned to the different blocks in the memory array 11 and further each block can be independently accessed, the data of the addresses A0 to A3 can be read at a same time. Thus, the sense amplifiers $15_1$ to $15_4$ obtain data Q0, E1, Q2 and Q3, respectively. Here, E1 is a data read from the data cell $17_2$ corresponding to the address A1. Among the data Q0, E1, Q2 and Q3 obtained in this read cycle, the data Q0 corresponding to the address A0 is outputted to the outside.

When the data are read from the data cells 17, the ECC circuits $33_1$ to $33_4$ carries out the error detection on the read data. The fact that the error exists in the data E1 read from the address A1 is detected by the ECC circuit $33_2$. Then, the error correction is carried out on the data cell $17_2$ corresponding to the address A1. Specifically, an internal write enable signal IWE is activated, and the data of the data cell $17_2$ corresponding to the address A1 is corrected (namely, reversed). It should be noted that as mentioned above, even when the data error actually exists in the reference cell $18_2$, the data of the data cell $17_2$ is corrected. In this exemplary embodiment, the MRAM that was initially in the state B is transited to the state C.

In the next read cycle, the address A1 is given as the address input. When the sense enable signal SE is again activated, the data Q0, E'1, Q2 and Q3 are obtained from the data cells 17 corresponding to the addresses A0 to A3 in response to the activation of the sense enable signal SE. FIG. 15 shows an operation in which the data are read even from the addresses A0 to A3 at a same time. However, a special design may be employed to prevent the data from being read from the addresses A0 to A3 in which the data error is not detected.

When the data is read from the data cell 17 corresponding to the address A1, the ECC circuit $33_2$ again carries out the error detection on the read data E'1. In this exemplary embodiment, the reference cell $18_2$ originally has a data error. That is, the MRAM is already transited to the state C in FIG. 8. Thus, an error is detected in the data E'1 read from the address A1. When the data error is detected, the ECC circuit $33_2$ carries out the error correction on the data E'1 and calculates the correct data Q1. The calculated correct data Q1 is outputted to the outside.

Subsequently, the internal write enable signal IWE is activated, and the data of the reference cell $18_2$ is corrected. Thus, the MRAM is transited to the state A.

In the next read cycle, the address A2 is given as the address input. When the sense enable signal SE is again activated, the data is again obtained from the data cell 17 corresponding to the address A1 in response to the activation of the sense enable signal SE. The data Q0, E"1, Q2 and Q3 are obtained from the data cells 17 corresponding to the addresses A0 to A3. Of the data Q0, E1, Q2 and Q3 obtained in this read cycle, the data Q0 corresponding to the address A2 is outputted to the outside.

When the data is read from the data cell 17 corresponding to the address A1, the ECC circuit $33_2$ again carries out the error detection on the read data E"1. When the data error is detected, the ECC circuit $33_2$ carries out the error correction on the data E"1 and writes the correct data Q1 to the data cell 17 corresponding to the address A1. Consequently, the MRAM in this exemplary embodiment is returned to the normal state, because the error correction of the data cell 17 is succeeded.

In the next read cycle, the address A3 is given as the address input. When the sense enable signal SE is again activated, the data Q0 to Q3 are obtained from the data cells 17 corresponding to the addresses A0 to A3 in response to the activation of the sense enable signal SE. Of the data Q0 to Q3 obtained in this read cycle, the data Q0 corresponding to the address A3 is outputted to the outside.

In the read operation based on the foregoing procedure, a period during which the reference cell 18 is corrected is not required to be prepared after the output of the read data Q0 to Q3. Thus, it does not become necessary to generate a signal for refusal or inhibition of the external access, which can effectively improve the compatibility with a memory device other than the MRAM.

Third Exemplary Embodiment

In the third exemplary embodiment, the data errors in the data cell 17 and the reference cell 18 are corrected by a procedure different from those of the first exemplary embodiment and the second exemplary embodiment.

Figure 16:
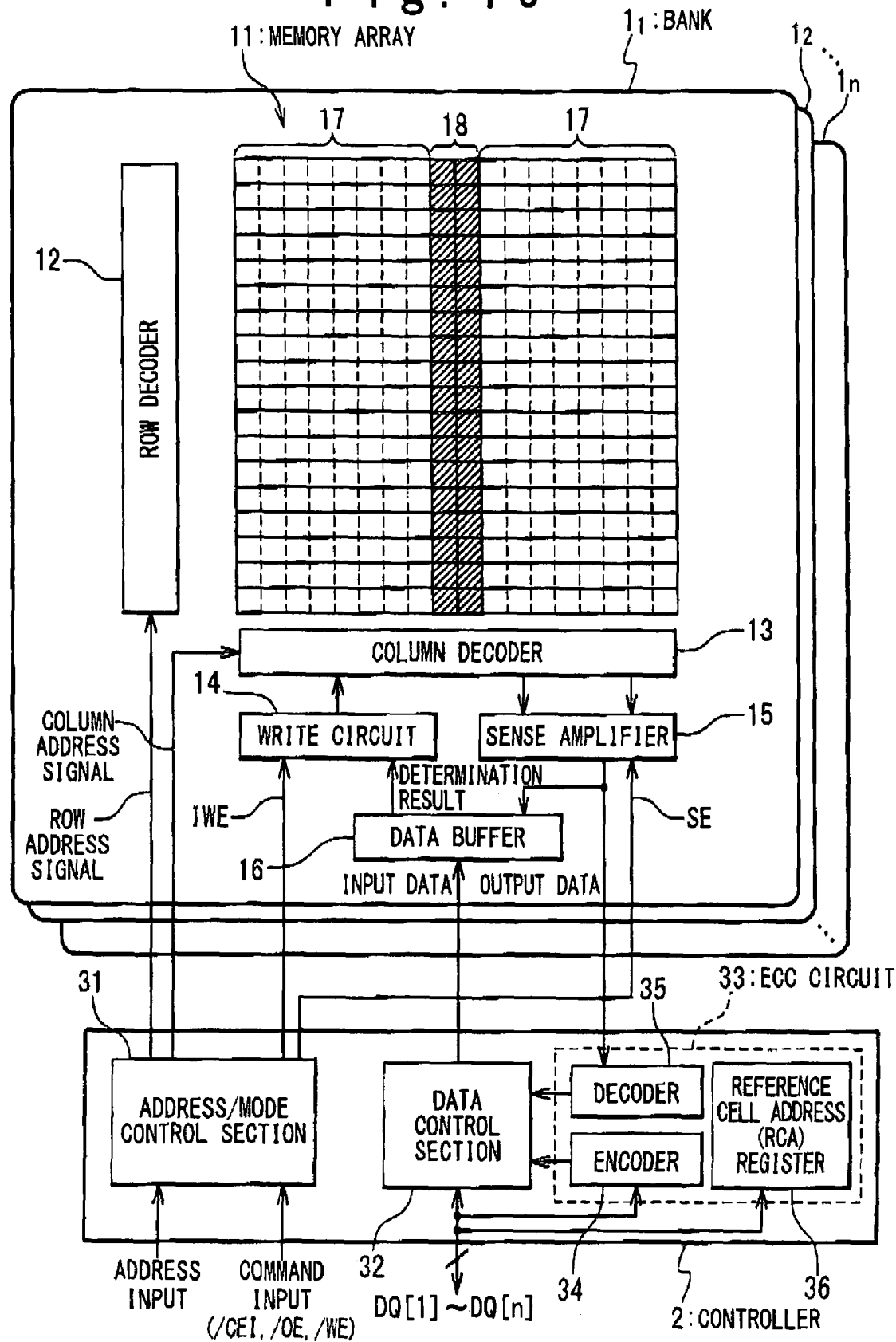
FIG. 16 is a block diagram showing a configuration of the MRAM according to a third exemplary embodiment of the present invention.

FIG. 16 is a block diagram showing a configuration of the MRAM according to the third exemplary embodiment of the present invention. The configuration of the MRAM in the third exemplary embodiment has the configuration substantially similar to that of the MRAM in the first exemplary embodiment shown in FIG. 6. The difference lies in that a reference cell address register (RCA register) 36 is provided in the ECC circuit 33 to store a reference cell address (a column address in this exemplary embodiment) specified in a read operation in which an error has been detected. In this exemplary embodiment, the reference cell address stored in the RCA register 36 is used to correct the data errors in the data cell 17 and the reference cell 18.

Figure 17:
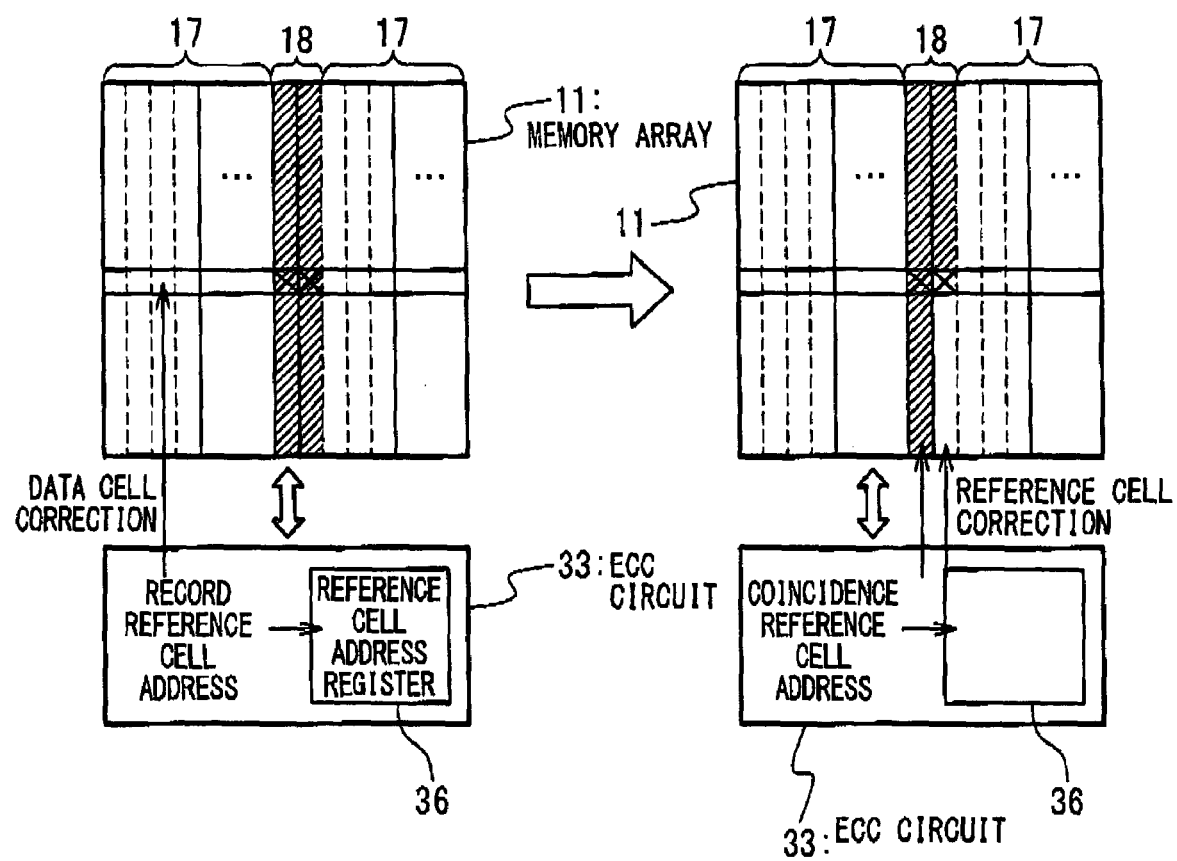
FIG. 17 is a diagram showing the concept of the operation of the MRAM in this exemplary embodiment.

FIG. 17 is a diagram showing the concept of the operation of the MRAM in this exemplary embodiment. In the MRAM in this exemplary embodiment, when a data error is detected in twice read operations that are carried out by using a same reference cell, a data error is determined to be in the reference cell, and the data error in the reference cell is corrected. Specifically, when the data error is detected in one read operation, the error correction is firstly carried out on the data cell 17. At this stage, the reference cell 18 is not corrected. Instead, the address of the reference cell 18 (a reference cell address) used in the read operation is registered in the RCA register 36.

When it is sensed in the MRAM in this exemplary embodiment that the data error is detected in the twice read operations which are carried out from the reference cell address registered in the RCA register 36 by using the same reference cell 18, the reference cell 18 is corrected. This is because the fact that the data errors are detected in both of the twice read operations by using the same reference cell 18 implies that the probability in which an error is in the reference cell 18 is high. After the correction of the reference cell 18, the reference cell 18 is used to carry out the data correction on the data cell 17 in which the read operation is carried out.

Figure 18:
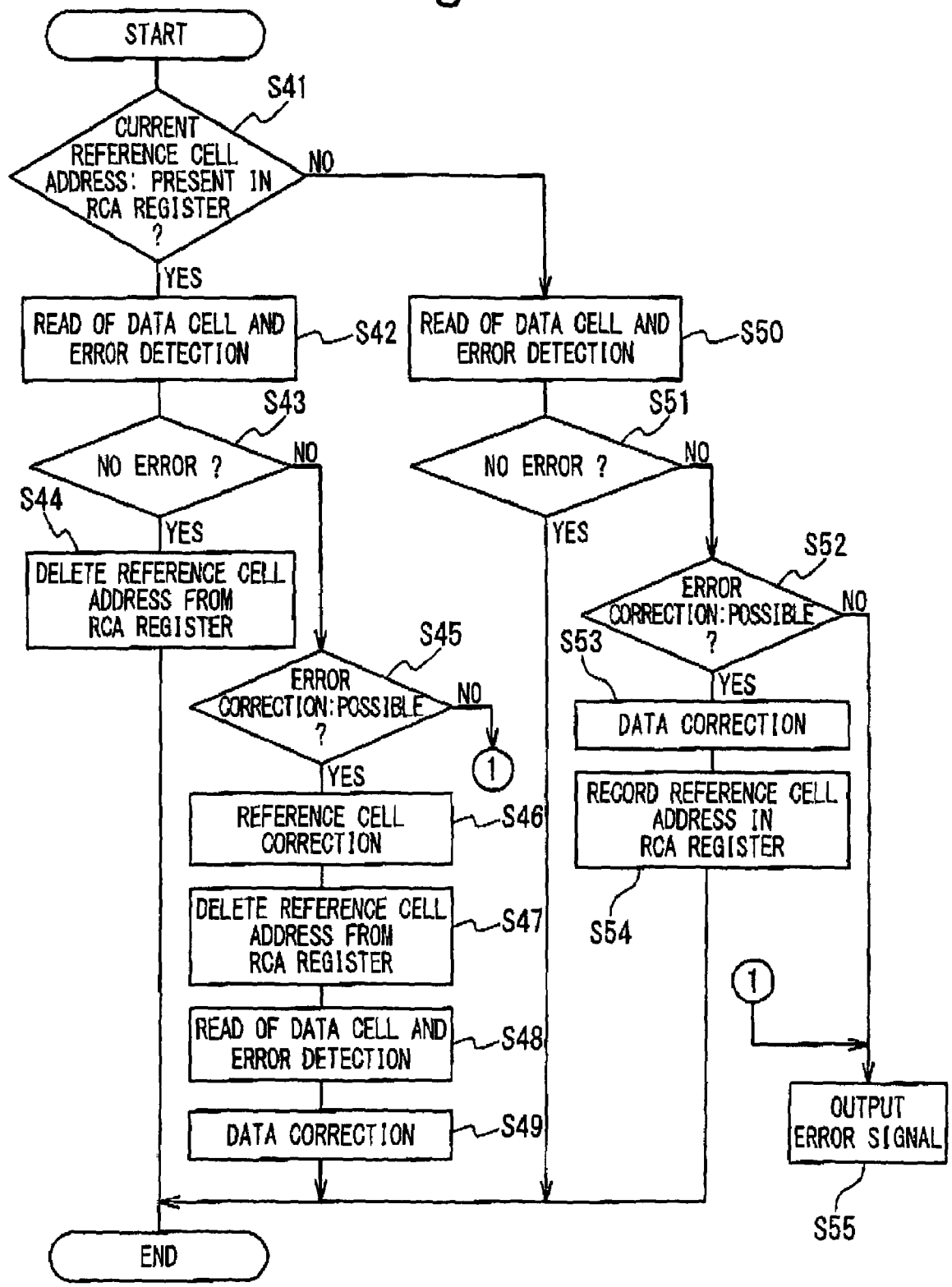
FIG. 18 is a flowchart showing a specific procedure of the read operation of the MRAM in this exemplary embodiment.

FIG. 18 is a flowchart showing a specific procedure of the read operation of the MRAM in this exemplary embodiment. When a row address and a column address are specified and the read operation is started, whether or not the reference cell address used in the read operation is registered in the RCA register 36 is determined (Step S41). In this exemplary embodiment, the reference cell address coincides with the row address.

If the reference cell address is not registered in the RCA register, a data is read from a data cell 17, and an error detection is further carried out on the read data (Step S50). If any error is not detected (Step S51), the read data is outputted to the outside, and the read operation is completed. If an error is detected at the step S50, the ECC circuit 33 further determines whether or not an error correction is possible (Step S51). If the error correction is determined to be impossible, an error signal is outputted to stop the read operation (Step S55). If the error correction is determined to be possible, the data after the error is corrected is outputted to the outside, and the data in the data cell 17 is further corrected (Step S53). Moreover, the reference cell address used in the read operation is registered in the RCA register 36 (Step S54).

On the other hand, if the reference cell address is registered in the RCA register 36, the data is read from the data cell 17, and the error detection is further carried out on the read data (Step S42). If the error is not detected (Step S43), the reference cell address used in the read operation is removed or deleted from the RCA register 36. This is because the fact that the data error is detected in only one of the twice read operations using the same reference cell 18 implies that the probability is high in which the data error is not in the reference cell 18. Moreover, the read data is outputted to the outside, and the read operation is completed.

If the error is detected at the step S42, the ECC circuit 33 further determines whether or not the error correction is possible (Step S45). If the error correction is determined to be impossible, the error signal is outputted to stop the read operation (Step S55).

If the error correction is determined to be possible, the data after error is corrected is outputted to the outside. Moreover, the data of the reference cell 18 that is specified by the reference cell address is corrected (Step S46), and the reference cell address is removed from the RCA register 36 (Step S47). In addition, the data is read from the data cell 17 in which the read operation is carried out by using the reference cell 18, and the error detection is carried out on the read data (Step S48). If the error is detected, the data in the data cell 17 is corrected, and the read operation is completed.

According to such an operation, even if whether a data error exists in the data cell 17 or the reference cell 18 is not determined, the MRAM can be returned to the normal state at the high probability.

The invention claimed is:

1. An operation method of a magnetic random access memory (MRAM), contains:
    (A) reading a data from a data cell by using a reference signal which is generated by using a reference cell;
    (B) performing an error detection on the read data;
    (C) correcting the data stored in the data cell, when an error is detected in the read data;
    (D) reading the data from the data cell as a first re-read data after said (C), when the error is detected in the read data,
    (E) performing the error detection on the first re-read data;
    (F) correcting the data stored in the reference cell, when an error is detected in the first re-read data;
    (G) reading the data from the data cell as a second re-read data after said (F), when the error is detected in the first re-read data;
    (H) performing the error detection on the second re-read data; and
    (I) correcting the data stored in the data cell again, when the error is detected in the second re-read data.

2. The operation method according to claim 1, wherein said (A) to (C) are carried out in one of a plurality of read cycles, and said (D) to (I) are carried out after completion of a final one of the plurality of read cycles.

3. The operation method according to claim 1, wherein said (A) to (C) are carried out in a first one of a plurality of read cycles,
    said (D) to (F) are carried out in a second one of the plurality of read cycles after the first read cycle, and said (G) to (I) are carried out in a third one of the plurality of read cycles after the second read cycle.

4. An operation method of a magnetic random access memory (MRAM) which comprises first to $n^{th}$ data cells and first to $n^{th}$ reference cells (n is an integer equal to or more than 3), and in which data write is performed by using a toggle write, said operation method comprising:
- (A-1) reading data from the first to $n^{th}$ data cells as first to $n^{th}$ read data in response to a reference signal which is generated by using the first to $n^{th}$ reference cells, respectively;
- (A-2) performing an error detection on the first to $n^{th}$ read data;
- (A-3) performing an error correction on a first output data of the first to $n^{th}$ read data to output to an external unit in a first read cycle;
- (A-4) correcting the data stored in the first data cell, when an error is detected in the first read data in the first read cycle;
- (B-1) performing the error correction on a second output data of the first to $n^{th}$ read data to output to the external unit in a second read cycle after the first read cycle;
- (B-2) reading the data from the first data cell as a first re-read data in the second read cycle, when an error is detected in the first read data at said (A-2);
- (B-3) performing the error detection on the first re-read data at the second read cycle;
- (B-4) correcting the data stored in the first reference cell at the second read cycle, when the error is detected in the first re-read data;
- (C-1) performing the error correction on a third output data of the first to third read data to output to the external unit in a third read cycle after the second read cycle;
- (C-2) reading the data from the first data cell as a second re-read data in the third read cycle, when the error is detected in the first re-read data at said (B-2);
- (C-3) performing the error detection on the second re-read data at the third read cycle; and
- (C-4) correcting the data stored in the first data cell again at the third read cycle, when the error is detected in the second re-read data.

5. An operation method of a magnetic random access memory (MRAM), in which data write is carried out through a toggle write, said operation method comprising:
- (A) reading a data from a data cell by using a reference signal which is generated by using a reference cell;
- (B) performing an error detection on the read data;
- (C) writing an input write data into the data cell through the toggle write;
- (D) reading a data from the data cell as a first re-read data after said (C), when an error is detected in the read data;
- (E) performing the error detection on the first re-read data;
- (F) correcting a data stored in the reference cell, when an error is detected in the first re-read data;
- (G) reading a data from the data cell as a second re-read data after said (F), when an error is detected in the first re-read data;
- (H) performing the error detection on the second re-read data; and
- (I) correcting the data stored in the data cell again, when an error is detected in the second re-read data.

6. An operation method of a magnetic random access memory (MRAM), comprising:
- specifying an address;
- reading a data from a selection data cell selected based on the address as a read data by using a selection reference cell selected based on the address;
- detecting an error in the read data;
- examining whether or not a reference cell address as an address of the selection reference cell is registered in a reference cell address storing unit;
- correcting an error in the selection data cell and registering the reference cell address in the reference cell address storing unit, when the reference cell address is not registered in the reference cell address storing unit and when the error is detected in the read data; and
- correcting the error in the reference cell, when the reference cell address is registered in the reference cell address storing unit and when the error is detected in the read data.

7. The operation method according to claim 6, further comprising:
- removing the reference cell address from the reference cell address storing unit, when the reference cell address is registered in the reference cell address storing unit and when the error is not detected in the read data.

8. The operation method according to claim 6, further comprising:
- correcting the error in the reference cell, when the reference cell address is registered in the reference cell address storing unit and when the error is detected in the read data,
- (A) removing the reference cell address from the reference cell address storing unit;
- (B) reading a re-read data from the data cell from which the data is read by using the reference cell;
- (C) detecting an error in the re-read data; and
- (D) correcting the error in the data cell from which the data is read, when the error is detected in the re-read data.

9. A magnetic random access memory (MRAM) comprising:
- a memory array comprising a data cell and a reference cell; and
- a peripheral circuit configured to read a data from the data cell by using a reference signal generated which is generated using the reference cell and to write a data into the data cell through a toggle write,
- said peripheral circuit is configured to:
- (A) perform an error detection on the read data read out from the data cell and to correct the data stored in the data cell when an error is detected in the read data;
- (B) to read the data from the data cell as a first re-read data after the correction of the data cell and to perform the error detection on the first re-read data;
- (C) to correct a data stored in the reference cell, when an error is detected in the first re-read data;
- (D) to read the data from the data cell as a second re-read data after the correction of the reference cell and to perform the error detection on the second re-read data; and
- (E) to correct the data stored in the data cell again, when an error is detected in the second re-read data.

10. A magnetic random access memory (MRAM) comprising:
- first to $n^{th}$ data cells (n is an integer equal to or more than 3);
- first to $n^{th}$ reference cells; and
- a peripheral circuit comprising first to $n^{th}$ ECC circuits,
- wherein said peripheral circuit, in a first read cycle, is configured to:
- (A-1) read data from the first to $n^{th}$ data cells as first to $n^{th}$ read data by using a reference signal which is generated by using the first to $n^{th}$ reference cells, respectively;
- (A-2) perform an error detection on the first to $n^{th}$ read data by using said first to $n^{th}$ ECC circuits;

(A-3) perform an error correction on a first output data of the first to $n^{th}$ read data to output to an external unit; and (A-4) correct the data stored in the first data cell, when an error is detected in the first read data in the first read cycle, wherein said peripheral circuit, in a second read cycle after the first read cycle, is configured to:

(B-1) perform an error correction on a second output data of the first to $n^{th}$ read data to output to the external unit;

(B-2) read the data from the first data cell as a first re-read data, when the error is detected in the first read data;

(B-3) perform the error detection on the first re-read data; and (B-4) correct the data stored in the first reference cell, when an error is detected in the first re-read data, and said peripheral circuit, in a third read cycle after the second read cycle, is configured to:

(C-1) perform an error correction on a third output data of the first to third read data to output to the external unit;

(C-2) read the data from the first data cell as a second re-read data, when an error is detected in the first re-read data;

(C-3) perform an error correction on the second re-read data; and (C-4) correct the data stored in the first data cell again, when the error is detected in the second re-read data.

11. A magnetic random access memory (MRAM) comprising:

a memory array comprising data cells and reference cells; and a peripheral circuit comprising a reference cell address storing unit;

wherein said peripheral circuit is configured to:

(A) select a selection reference cell from said reference cells and a selection data cell from said data cells in response to an externally specified address;

(B) read a data from the selection data cell by using a reference signal which is generated by using the selection reference cell;

(C) perform an error detection on the read data;

(D) check whether or not a reference cell address as an address of the selection reference cell is registered in said reference cell address storing unit;

(E) to correct an error of selection data cell and register the reference cell address in said reference cell address storing unit, when the reference cell address is not registered in said reference cell address storing unit, and when an error is detected in the read data; and (F) correct an error of the selection reference cell, when the reference cell address is registered in said reference cell address storing unit, and when an error is detected in the read data.

* * * * *